US012568651B2

(12) United States Patent
Smith et al.

(10) Patent No.: US 12,568,651 B2
(45) Date of Patent: Mar. 3, 2026

(54) SEMICONDUCTOR STRUCTURE HAVING STACKED GATES AND METHOD OF MANUFACTURE THEREOF

(71) Applicant: Tokyo Electron Limited, Tokyo (JP)

(72) Inventors: Jeffrey Smith, Clifton Park, NY (US); Lars Liebmann, Mechanicville, NY (US); Daniel Chanemougame, Niskayuna, NY (US); Paul Gutwin, Williston, VT (US); Kandabara Tapily, Mechanicville, NY (US); Subhadeep Kal, Albany, NY (US); Robert Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 830 days.

(21) Appl. No.: 17/851,975

(22) Filed: Jun. 28, 2022

(65) Prior Publication Data

US 2022/0416048 A1      Dec. 29, 2022

Related U.S. Application Data

(60) Provisional application No. 63/216,038, filed on Jun. 29, 2021.

(51) Int. Cl.
*H10D 30/43* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .............. H10D 84/0177; H10D 62/121; H01L 29/7869
See application file for complete search history.

(56) References Cited

U.S. PATENT DOCUMENTS 9,431,304 B2 * 8/2016 Huang ................. H10D 64/017
10,833,078 B2 11/2020 Smith et al.
(Continued)

Primary Examiner — William B Partridge
Assistant Examiner — Mehek Ahmed
(74) Attorney, Agent, or Firm — Oblon, McClelland, Maier & Neustadt, L.L.P.

(57) ABSTRACT

Aspects of the present disclosure provide a method, which includes providing a semiconductor structure including a first lower semiconductor device and a first upper semiconductor device stacked vertically over the first lower semiconductor device. The first lower semiconductor device has one or more first lower channels. The first upper semiconductor device has one or more first upper channels. First work function metal (WFM) can cover the first lower channels and the first upper channels. The method can also include recessing the first WFM to uncover the first upper channels of the first upper semiconductor device, depositing a monolayer on uncovered dielectric surfaces of the semiconductor structure, depositing isolation dielectric on the first WFM of the first lower semiconductor device, and depositing second WFM to cover the first upper channels of the first upper semiconductor device. The isolation dielectric isolates the first lower semiconductor device from the first upper semiconductor device.

14 Claims, 20 Drawing Sheets

(51) Int. Cl.
  *H10D 30/67*      (2025.01)
  *H10D 62/10*      (2025.01)
(52) U.S. Cl.
  CPC ..... *H10D 30/6755* (2025.01); *H10D 30/6757*
      (2025.01); *H10D 62/121* (2025.01)

(56)          References Cited

U.S. PATENT DOCUMENTS

| | | | |
|---|---|---|---|
| 10,847,424 | B2 | 11/2020 | Tapily et al. |
| 11,588,030 | B2 * | 2/2023 | Lee ................... H01L 21/76829 |
| 2023/0125316 | A1 * | 4/2023 | Xie ................... H10D 84/0172 |
| | | | 257/351 |

* cited by examiner

SEMICONDUCTOR STRUCTURE HAVING STACKED GATES AND METHOD OF MANUFACTURE THEREOF

INCORPORATION BY REFERENCE

This present disclosure claims the benefit of U.S. Provisional Application No. 63/216,038, entitled "Semiconductor structure Having Stacked Gates and Method Of Manufacture Thereof" filed on Jun. 29, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips, such as central processing units (CPUs), graphics processing units (GPUs), field programmable gate arrays (FPGAs) and System on a chip (SoC)), is being pursued.

SUMMARY

Aspects of the present disclosure provide a method for manufacturing a semiconductor structure. For example, the method can include providing a semiconductor structure including a first lower semiconductor device and a first upper semiconductor device stacked vertically over the first lower semiconductor device. The first lower semiconductor device can have one or more first lower channels. The first upper semiconductor device can have one or more first upper channels. First work function metal (WFM) covers the first lower channels and the first upper channels. The method can also include recessing the first WFM to uncover the first upper channels of the first upper semiconductor device, depositing a monolayer on uncovered dielectric surfaces of the semiconductor structure, and depositing isolation dielectric on the first WFM of the first lower semiconductor device. The isolation dielectric isolates the first lower semiconductor device from the first upper semiconductor device. The method can also include depositing second WFM to cover the first upper channels of the first upper semiconductor device.

In an embodiment, the isolation dielectric can be deposited using a plasma-free deposition process. In another embodiment, the isolation dielectric can be deposited at a temperature below 350 degrees Celsius.

In an embodiment, the monolayer can include a self-assembled monolayer (SAM), and depositing the monolayer includes depositing the SAM on the uncovered dielectric surfaces while the first WFM remains uncovered by the SAM. The SAM is configured to resist deposition of the isolation dielectric.

In an embodiment, the first upper semiconductor device can include one or more n-type metal oxide semiconductor (NMOS) devices, and the first lower semiconductor device can include one or more p-type metal oxide semiconductor (PMOS) devices. For example, the first WFM includes TiN, and the second WFM includes TiAl. In some embodiments, the first lower semiconductor device and the first upper semiconductor device can include lateral gate-around (GAA) transistors with the first lower channels and the first upper channels formed from nanosheets.

In an embodiment, the semiconductor structure can further include a second lower semiconductor device and a second upper semiconductor device stacked vertically over the second lower semiconductor device. The second lower semiconductor device and the second upper semiconductor device are laterally adjacent to the first lower semiconductor device and the first upper semiconductor device. The method can further include etching the semiconductor structure to form a cut area between the first lower and upper semiconductor devices and the second lower and upper semiconductor devices, and filling the cut area with separation dielectric to separate the first lower and upper semiconductor devices from the second lower and upper semiconductor devices. In an embodiment, the isolation dielectric acts as an etch stop when the semiconductor structure is etched. In various embodiments, the semiconductor structure can be etched beyond a length of the isolation dielectric.

In an embodiment, the method can further include covering the uncovered first upper channels of the first upper semiconductor device with a gap-fill material, transferring an isolation dielectric pattern corresponding to the isolation dielectric onto the gap-fill material, and etching the gap-fill material based on the isolation dielectric pattern to uncover the first upper channels of the first upper semiconductor device. For example, etching the gap-fill material can include anisotropically etching the gap-fill material based on the isolation dielectric pattern, with the gap-fill material blocked by the first upper channels intact, and isotropically etching the gap-fill material blocked by the first upper channels. In another embodiment, the isolation dielectric region is biased from the isolation dielectric.

Aspects of the present disclosure further provide a semiconductor structure. For example, the semiconductor structure can include a lower semiconductor device having one or more lower channels and first work function metal (WFM) covering the lower channels, and an upper semiconductor device stacked vertically over the lower semiconductor device. The upper semiconductor device can have one or more upper channels and second WFM covering the upper channels. The semiconductor structure can also include a monolayer formed on dielectric surfaces of the semiconductor structure, and an isolation dielectric deposited between the lower semiconductor device and the upper semiconductor device to isolate the lower semiconductor device from the upper semiconductor device.

Note that this summary section does not specify every embodiment and/or incrementally novel aspect of the present disclosure or claimed present disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this present disclosure that are proposed as examples will be described in detail with reference to the following figures, wherein like numerals reference like elements, and wherein.

DETAILED DESCRIPTION

Figure 1:
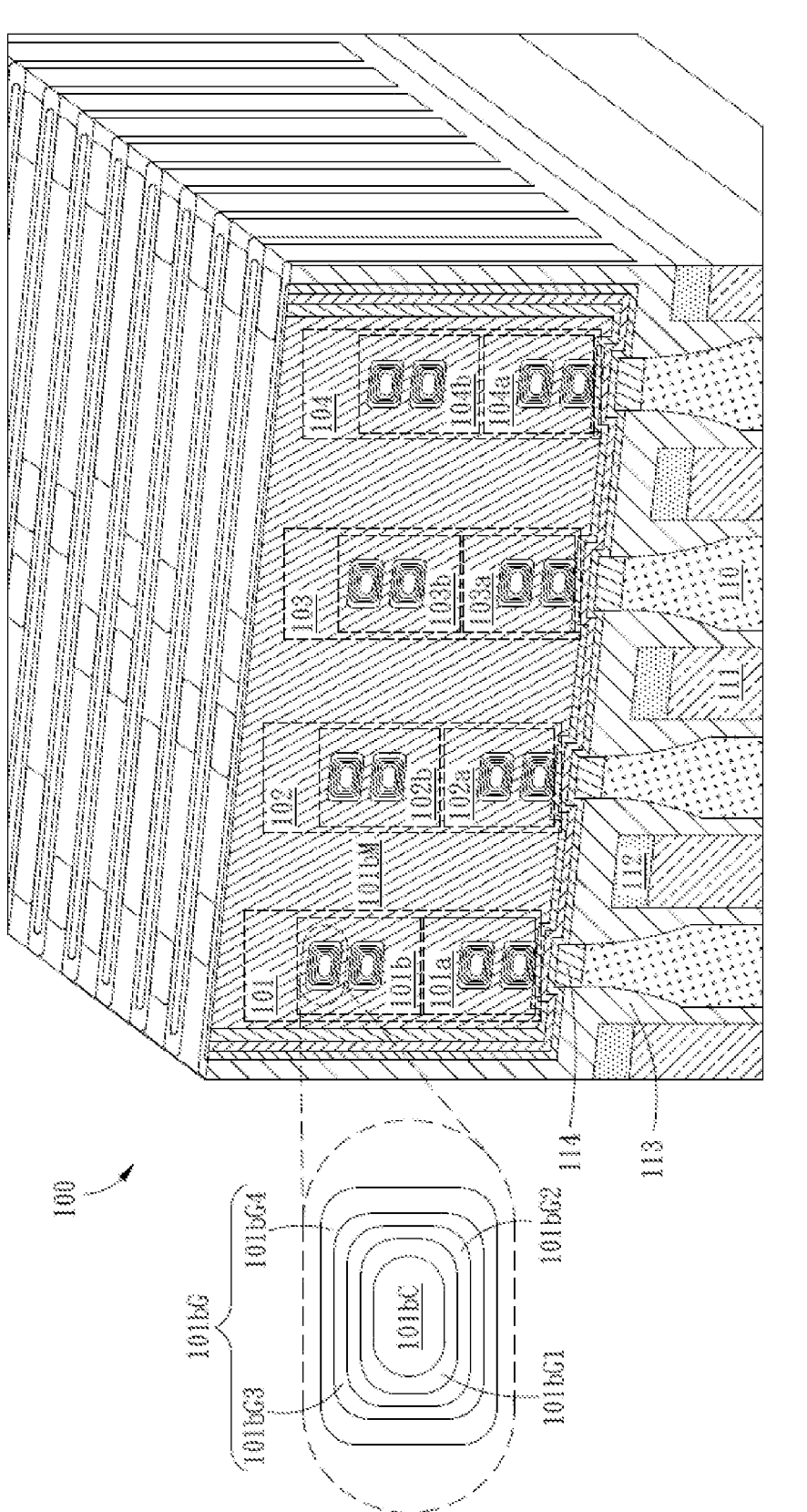
FIGS. 1-20 show schematic views of various intermediary steps of an exemplary manufacturing process for fabricating a semiconductor structure according to the some embodiments of the present disclosure.

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

U.S. Pat. No. 10,833,078 entitled "Semiconductor structure Having Stacked Gates and Method of Manufacture Thereof" describes a complementary FET (CFET) device in which NMOS transistors and devices are stacked vertically overtop PMOS transistors and devices, and vice-versa. U.S. Pat. No. 10,833,078 is incorporated herein by reference in its entirety. In this CFET, the vertically stacked transistors can be electrically connected to form a common gate, or the vertically stacked NMOS and PMOS gates and can be isolated from one another and have separate input connections to form a pair of complementary split, or individual gates.

The integration of making such a vertically stacked split gate can follow several options as outlined in U.S. Pat. No. 10,833,078. One option is a heterogeneous integration approach in which a first transistor and device pair can be made on a lower-tier, followed by physical bonding of a new wafer over the transistor and device pair from which the upper-tier complementary transistor and device pair will be formed directly over the lower-tier transistor and device pair. In this method, a dielectric such as silicon oxide is used as the bonding material between both wafers. The functionality of this bonding dielectric can be used as the dielectric separation between the complementary transistors. Common gates in this integration can be formed through forming an inter-gate via that electrically connects the upper-tier transistor to the lower-tier complementary transistor.

Another option is a monolithic integration approach disclosed in U.S. Pat. No. 10,833,078, in which a vertically stacked split gate is formed. This integration includes several steps. A common PMOS and NMOS vertically stacked pair of transistors is formed in which all gate stack materials of a high-k metal gate (HKMG) stack including high-k dielectric, work function metals (WFMs), and any liners and etch-stop layers are deposited around the channel through selective deposition processes in which each layer of the HKMG stack is deposited only on the material preceding it within the HKMG stack. This deposition has selectivity to the dielectric making up the sidewall of the opened replacement gate structure. The HKMG structure is filled with a conductive metal such as tungsten (W). Tungsten is recessed selective to the outer-most material incorporated into the HKMG stack, which for some purposes can be a conductive etch-stop material which will have some selectivity to the tungsten recess etch process, such as TaN or other similar materials. The recess of the tungsten can vertically place the top-most height of the recessed tungsten fill within the vertical space between the NMOS and PMOS channels. For the case of an NMOS transistor stacked overtop a PMOS transistor, removal of the etch-stop layer and PMOS work function metal from the exposed NMOS channels can follow the recess of the tungsten. Selective or non-selective deposition can be used to form the NMOS work function metal over the exposed NMOS channels. A temporary patterning transfer material such as spin-on-carbon into the physical gate in which the tungsten has been recessed can be used as a gap-fill material. A cut pattern can then be transferred into the temporary patterning transfer material which will be used as a "cut" between the formed transistors in the lower-tier in order to define individual transistors between individual standard cells. This cut is transferred into the tungsten fill of the lower-tier transistors to electrically isolate individual transistors across different standard cells. The patterning transfer material can then be removed without causing any degradation to the formed transistors of the upper-tier. Selective deposition of a dielectric on the exposed lateral and vertical faces of the tungsten (both the recessed lateral surface of the recess tungsten as well as the vertical faces produced by the transfer of the gate cuts into the tungsten) is executed in which a finite thickness of dielectric fills in the cut structures and produces a desired isolation thickness over the lower-tier transistors to isolate the lower-tier transistors from the upper-tier transistors. Then final tungsten or other suitable conductive metal fill is completed for the upper-tier transistors.

Significant development activity has gone into the develop of unit processes to enable this integration including: (1) development of a selective deposition process of HfO as a high-k dielectric directly on silicon and silicon germanium channels, (2) formation of an interface oxide layer through the migration of oxygen radicals through the selectively deposited high-k dielectric film to form the interface layer between the silicon channel and the high-k dielectric, (3) selective deposition of work function metals onto the high-k dielectric film and other work function metals, (4) direct etching of metals such as tungsten in order to form the HKMG cuts to electrically isolate transistors between adjacent standard cells, and (5) isotropic recess etching of the high conductive metals such as tungsten within a physical gate structure, et cetera.

Many challenges still persist in these integration films during the development process. One challenge is that deposition of many work function metals requires temperatures exceeding 400 C, which exceeds the thermal decomposition temperatures associated with most organic self-aligned monolayer (SAM) materials which help enable selective deposition processes. Another challenge is that deposition of many dielectric materials, which would be suitable in isolating the vertically stacked transistors, would require plasma enhancement in order to lower the deposition temperature while maintaining film quality. The risk is that this plasma exposure could likewise damage or destroy the functionality of many organic SAM materials. Another challenge is that selective deposition of the high-k dielectric film would require additional integration steps in order to allow for complementary doping of the high-k dielectric films in the NMOS and PMOS regions for a vertically stacked transistor. Another challenge is that incorporating etch-stop layers within the HKMG stack in order to enable selective etching of tungsten to the work function metals in the process can add significant complication to the HKMG stack in terms of setting desired work function metal of the device, and adding more thickness to the HKMG stack which in turns leads to larger vertical pitch scaling of the nanosheets, which in turn will lead to higher overall device parasitic, as well as more difficulty in setting discreet threshold voltage tuning methods to the transistor.

New integration concepts herein can address these challenges in a manner which can lead to more rapid implementation of stacked transistors and eventual adoption to high volume manufacturing. Likewise, development of new hardware capability from Tokyo Electron also makes more cost-effective integrations to be realized for the formation of stacked gates.

Currently the industry is planning adoption of complementary FET by 2028 in high-volume manufacturing and having a working set of unit processes and associated hardware will be needed for industry-wide demonstration several years prior to this date. Within the industry, there has been a push to provide scaling assessments from one technology node to the next by focusing not only on power, performance, area (PPA assessment), but to add other variables such as cost and time-to-market to form PPACt assessments. In order to meet 2028 high-volume readiness targets for technologies such as monolithic stacked transistors, many of the new capabilities embedded in our hardware development need to be incorporated into new integrations that can have significant positive impact to both the cost and time-to-market segments of the PPACt assessment such that a 2028 high-volume manufacturing date can be attained for implementation of complementary FET technology. This present disclosure includes additional integration processes that enable the vertically stacked complementary transistors which can be isolated from one another in monolithic integration approach which bypasses many of the challenges faced in the initial integration described in U.S. Pat. No. 10,833,078.

Techniques herein include stacked semiconductor devices and methods of fabrication. This includes a complementary FET device for which PMOS devices and transistors can be positioned on a lower-tier of the stacked complementary device while the NMOS devices and transistors are positioned on the upper-tier. Of course, embodiments can include PMOS or NMOS, but having PMOS on the lower-tier enables the PMOS source and drain contact to be connected directly to the bulk silicon in order for the lattice mismatch to provide some level of controllable strain into the PMOS channel. The integration flow and corresponding novel unit process capabilities and associated hardware are designed to a monolithic complementary FET device in which the channels for both NMOS and PMOS devices are built from a common starting wafer.

As was stated previously, standard cells based on complementary FET designs will need to incorporate both common and split gates in a stacked architecture. Common gates are where both the NMOS and PMOS transistors share a common input connection, and in a stacked architecture both transistors are electrically combined together through a common conductive fill metal. Split gates are where the NMOS and PMOS stacked transistors are isolated from one another by means of some form of dielectric separation and where both independent transistors have individual inputs.

There are several challenges with monolithic integrations of split gates. These challenges include that the nanosheets or channels within the physical gate structure are already formed by the time the dummy gate is opened and the replacement metal gate is to be formed. Thus physical obstructions are in place which prohibit many conventional processing techniques for the formation of the isolation dielectric which will be used to separate the split gates. Another challenge is that the upper-tier transistors benefit from NMOS type work function metals while the lower-tier transistors benefits from PMOS type work function metals.

In addition to the formation of the isolation dielectric to electrically isolate the upper-tier and lower-tier complementary transistors, additional cuts will be needed to isolate the transistors within one standard cell from their respective neighbors. This cut and dielectric fill process must be able to be supported in conjunction with the isolation dielectric processing used to form the electrical isolation between complementary transistors within a common standard cell For some applications where multiple height standard cells are used, meaning that the standard cell can be comprised of more than a single row height in order to provide additional pin access at lower back-end-of-the-line (BEOL) levels, it may be desired to have some transistors which extend to these multiple rows. Accordingly it may be necessary to form various iterations of how the split gates are defined such that there may be an NMOS transistor which extends across multiple row height but still be electrically isolated to the PMOS transistor within the same standard cell, or vice versa. There are other embodiments in which all NMOS and PMOS transistors within a multiple row height standard cell are all electrically isolated from one another.

Improved integration and unit-processing techniques herein, as well as hardware capability, can ensure that multiple row height standard cells incorporating CFET architecture can be produced in addition to the conventional CFET devices outlined in U.S. Pat. No. 10,833,078. Embodiments include several improvements from the representative integration process outlined in U.S. Pat. No. 10,833,078 and are shown in the figures.

FIGS. 1-20 show schematic views of various intermediary steps of an exemplary manufacturing process for fabricating a semiconductor structure 100 according to the some embodiments of the present disclosure. The manufacturing process can start with opening of a replacement gate where there are upper and lower stacks of nanowires/nanosheets. Referring to FIG. 1, the semiconductor structure 100 includes a stack of nanowires/nanosheets that can be partitioned into a plurality of semiconductor stacks, e.g., high-k metal gate (HKMG) stacks. In the example embodiment, the stack of nanowires/nanosheets is partitioned into a first semiconductor stack 101, a second semiconductor stack 102, a third semiconductor stack 103 and a fourth semiconductor stack 104 formed side by side over the substrate 110 in Y-direction, which can be used to form various semiconductor devices. For example, the first and second semiconductor stack 101 and 102 can be used to form a split gate CFET. As another example, each of the third and fourth semiconductor stacks 103 and 104 can be used to form a common gate CFET.

In the example embodiment, the substrate 110 is shown in the form of strips (substrate strips 110). The substrate 110 can be any suitable semiconductor material, such as silicon (Si), silicon carbide (SiC), sapphire, germanium (Ge), gallium arsenide (GaAs), silicon germanium (SiGe), indium phosphide (InP), diamond, and the like. The substrate 110 can be doped with an n-type and a p-type impurity. The substrate 110 can include various layers, such as conductive or insulating layers formed on a semiconductor substrate, a silicon-on-insulator (SOI) structure, and the like.

In an embodiment, a isolation dielectric 114 can be formed at an interface between the first to fourth semiconductor stacks 101 to 104 and the substrate 110. In other embodiments, the isolation dielectric 114 can be omitted, in order to provide additional strain on the channels of lower-tier semiconductor devices formed in the semiconductor stacks through incorporation of silicon and silicon germanium lattice mismatch.

In an embodiment, each of the first to fourth semiconductor stacks 101 to 104 can include multiple semiconductor devices stacked vertically over one another in Z-direction. For example, the first semiconductor stack 101 includes a first lower semiconductor device 101*a* and a first upper semiconductor device 101*b* stacked vertically over the first lower semiconductor device 101*a*, the second semiconductor stack 102 includes a second lower semiconductor device 102*a* and a second upper semiconductor device 102*b* stacked vertically over the second lower semiconductor device 102*a*, the third semiconductor stack 103 includes a third lower semiconductor device 103*a* and a third upper semiconductor device 103*b* stacked vertically over the third lower semiconductor device 103*a*, and the fourth semiconductor stack 104 includes a fourth lower semiconductor device 104*a* and a fourth upper semiconductor device 104*b* stacked vertically over the fourth lower semiconductor device 104*a*.

Each of the semiconductor devices 101*a*, 101*b*, 102*a*, 102*b*, 103*a*, 103*b*, 104*a* and 104*b* can include a PMOS device or an NMOS device. For example, each of the first, second, third and fourth lower semiconductor devices 101*a*, 102*a*, 103*a* and 104*a* can include a PMOS device, and each of the first, second, third and fourth upper semiconductor devices 101*b*, 102*b*, 103*b* and 104*b* can include an NMOS device.

In an embodiment, each of the semiconductor devices 101*a*, 101*b*, 102*a*, 102*b*, 103*a*, 103*b*, 104*a* and 104*b* can include one or more semiconductor bars, which can be formed from nanosheets or nanowires made of Si, Ge, SiGe, AlGaAs, GaAs, GaAsP, InP and the like, and a gate stack that covers the semiconductor bars in any suitable configuration, such as that used in Fin FET (FinFET), Gate All Around (GAA), tri-gate, Pi-gate, and the like. In the example embodiment, each of the semiconductor devices 101*a*, 101*b*, 102*a*, 102*b*, 103*a*, 103*b*, 104*a* and 104*b* can be a GAA semiconductor device, and include one or more semiconductor bars and a gate stack (or a gate) formed laterally around the semiconductor bars. For example, the first upper semiconductor device 101*b* can include a first upper set of semiconductor bars 101*b*C and a first upper gate stack 101*b*G. The upper semiconductor devices 102*b*, 103*b* and 104*b* are similar to the first upper semiconductor device 101*b* in terms of the structure and materials, and the lower semiconductor devices 101*a*, 102*a*, 103*a* and 104*a* are also similar to the first upper semiconductor device 101*b* in terms of structure, but differ from the first upper semiconductor device 101*b* in the materials. Therefore, the description is given to the first upper semiconductor device 101*b* for purposes of clarity, and only the material differences are further described. The first upper set of semiconductor bars 101*b*C can include one or more nanosheets or nanowires, e.g., two, that are stacked vertically in Z-direction. The first upper set of semiconductor bars 101*b*C can act as a first upper source, a first upper drain and a first upper channel 101*b*C of the first upper semiconductor device 111*b*. The first upper channel 101*b*C can include any suitable structure and material systems to provide a semiconductor channel when the first upper semiconductor device 101*b* is in operation. The channels of the semiconductor devices 101*a*, 101*b*, 102*a*, 102*b*, 103*a*, 103*b*, 104*a* and 104*b* may include different materials. In the example embodiment, each of the lower semiconductor devices 101*a*, 102*a*, 103*a* and 104*a* includes a p-type channel, and each of the upper semiconductor devices 101*b*, 102*b*, 103*b* and 104*b* includes an n-type channel.

In an embodiment, the first upper gate stack 101*b*G can include a high-dielectric constant (high-k) layer (or high-k film or high-k films) 101*b*G2 as a gate insulator over the first upper channel 101*b*C. The high-k layer 101*b*G2 can include any suitable dielectric material having a high dielectric constant, such as hafnium oxide (HfO). In an embodiment, the high-k layer 101*b*G2 of the first upper gate stack 101*b*G of the first upper semiconductor device 101*b*, and the high-k layers of the gate stacks of the upper semiconductor devices 102*b*, 103*b* and 104*b* as well, can be doped with n-type dipoles to assist with threshold voltage tuning. In other embodiments, the high-k layers of the gate stacks of the lower semiconductor devices 101*a*, 102*a*, 103*a* and 104*a*, which are PMOSs in the example embodiment, can be doped with p-type dipoles to assist with threshold voltage tuning.

Optionally, an interface layer 101*b*G1 can be further deposited and formed between the first upper channel 101*b*C and the high-k layer 101*b*G2. The interface layer 101*b*G1 can include a dielectric material such as $SiO_2$, HfSiO, SiON, and the like. The interface layer 101*b*G1 can be formed by chemical oxidation, thermal oxidation, atomic layer deposition (ALD), chemical vapor deposition (CVD), and the like. For example, a gate oxide layer can be grown or deposited through the high-k film after the selective deposition of the high-k film directly on the silicon, SiGe, or Ge channels is completed.

In an embodiment, a barrier layer (or conductive metal cap) 101*b*G3 can be deposited and formed over the high-k layer 101*b*G2. The barrier layer 101*b*G3 can be any suitable dielectric material, such as TiN, preventing diffusion between the high-k layer 101*b*G2 and a work-function (WF) layer (or work-function metal, WFM) 101*b*G4.

The WFM 101*b*G4 can adjust the work-function and affect a threshold voltage of the first upper gate stack 101*b*G. For example, the WFM 101*b*G4 can include, but is not limited to TiN, TiAl and TiAlN. In the example embodiment, the WFM 101*b*G4 and the WFMs of the gate stacks of the upper semiconductor devices 102*b*, 103*b* and 104*b* and the lower semiconductor devices 101*a*, 102*a*, 103*a* and 104*a* are p-type WFMs (PWFMs) and include TiN.

In an embodiment, a conductive liner (not shown) such as TiN can cover the WFM 101*b*G4. A highly conductive metal 101*b*M can cover the conductive liner as a gate fill. In an embodiment, the conductive metal 101*b*M can have anisotropic etching property, and include tungsten (W), ruthenium (Ru) and the like.

The semiconductor structure 100 also includes power rails (or buried power rails (BPRs)) 111 that are buried in the substrate 110. The power rails 111 can provide suitable power supplies, such as positive and negative power supplies, to the semiconductor structure 100. The power rails 111 can be formed by any suitable one or more conductive materials, such as ruthenium (Ru), copper (Cu), and the like. The power rails 111 can be formed using any suitable structure, such as disclosed in U.S. patent application Ser. No. 15/875,442, filed on Jan. 19, 2018, which is incorporated herein by reference in its entirety.

The power rails 111 are covered with interconnect caps (or buried power rail caps) 112. The interconnect caps 112 can isolate the power rails 111 from FETs and the like. The interconnect caps 112 can include one or more dielectric materials fabricated in any suitable structures. The interconnect caps 112 can include materials such as SiO, SiCO, SiCN, SiC, SiN, and the like.

The substrate strips 110 are isolated from the power rails 111 by shallow trench isolations (STIs) 113. The STIs 113 can prevent electric current leakage, for example, between the power rails 111 and the substrate strips 110. The STIs 113 can be fabricated using any suitable one or more dielectric materials and any suitable structure. The STIs 113 can include $SiO_2$, silicon nitride, silicon oxynitride, fluorine-doped silicate glass (FSG), phosphosilicate glass (PSG), borophosphosilicate glass (BPSG), a low-k dielectric, other suitable materials, or combinations thereof, and/or other suitable material know in the art.

In an embodiment, if complementary doping of the high-k layer is desired to provide for some margins of threshold voltage tuning, then a selective deposition of the doped high-k layer selective to the channel should be executed in which the NMOS and PMOS channels are alternately covered to selectively deposit the high-k layer with the desired n-type and p-type dipole dopants, respectively. This can be achieved through an integration method in which: (a) a gap-fill material can be filled within the replacement gate once the polysilicon or amorphous silicon is removed; (b) the gap-fill material can be recessed in order to reveal the nanosheets for the upper transistor devices while still covering the nanosheets for the lower transistor devices; (c) for the case of the upper semiconductor devices being NMOS, the doped high-k layer can be selectively deposited onto the silicon nanosheet and not on any sidewall dielectric within the gate cavity nor on the surface of the recessed gap-fill material; (d) the gap-fill material can be removed and the lower level nanosheets can then be selectively deposited with the complementary doped high-k material for PMOS channels, wherein the self-assembled monolayer (SAM) used to block the deposition on the sidewall dielectric will also attach to the high-k layer already deposited around the complementary NMOS channels so no additional counter-doped high-k dielectric would be deposited on the upper-tier channels; and (e) after the selective deposition of the complementary high-k layer, oxygen radicals can then be transferred through the respective high-k layer to form an interface layer (e.g., silicon oxide) between the channels and the high-k dielectric materials. Methods for the selective deposition of high-k dielectric on the silicon, silicon germanium, or germanium channels have been described in previous present disclosures by the Applicant. A separate present disclosure includes more detail on how to incorporate dipole doping into high-k dielectric films within vertically stacked transistor designs such as CFET.

Figure 2:
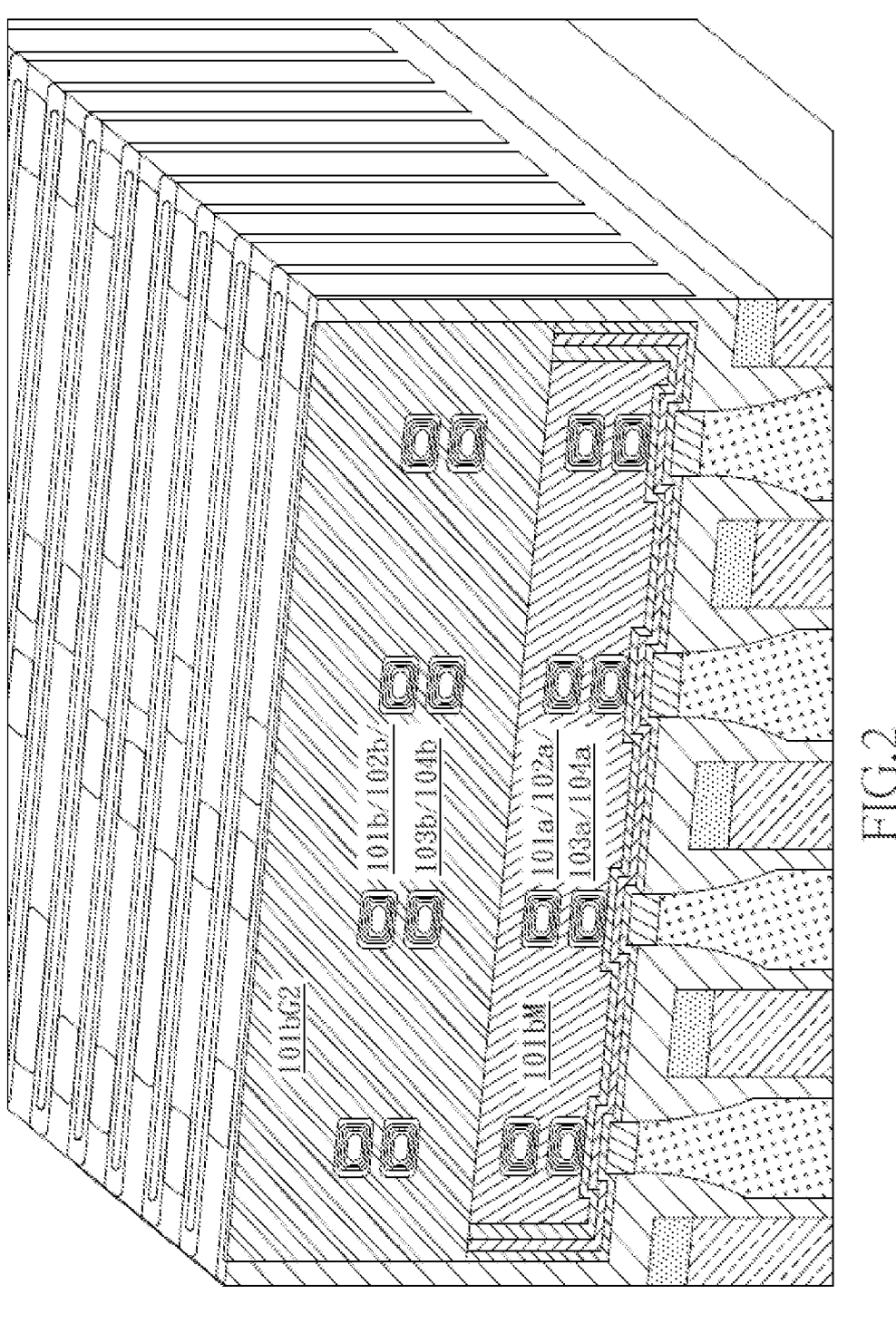

Referring to FIG. 2, an etch process can be incorporated in which the highly conductive metal 101bM, e.g., tungsten (W), and the PWFM 101bG4 (shown in FIG. 1) can be isotropically etched with high selectivity to the high-k layer 101bG2, e.g., HfO. The vapor-phase isotropic etch process can reduce the metal gate stack down to a vertical height in which the PMOS HKMG stack is only covering the lower-tier channels and where the top of the gate stack exists in a region between the NMOS and PMOS channels (between the upper semiconductor devices 101b, 102b, 103b and 104b and the lower semiconductor devices 101a, 102a, 103a and 104a). This example is showing the case where the high-k layer, e.g., the high-k layer 101bG2, has been deposited by a single, conformal step. If it is desired to incorporate complementary dipole doping into the high-k layers, the doped HfO layers can be selectively deposited only around the channels directly and not along the sidewall of the gate stack. In an embodiment, the etch process and chemistry used to isotropically recess the PMOS metal gate stack will likewise have excellent selectivity to the dielectric sidewall if it is composed of low-k dielectric materials such as silicon oxide or SiOC.

Figure 3:
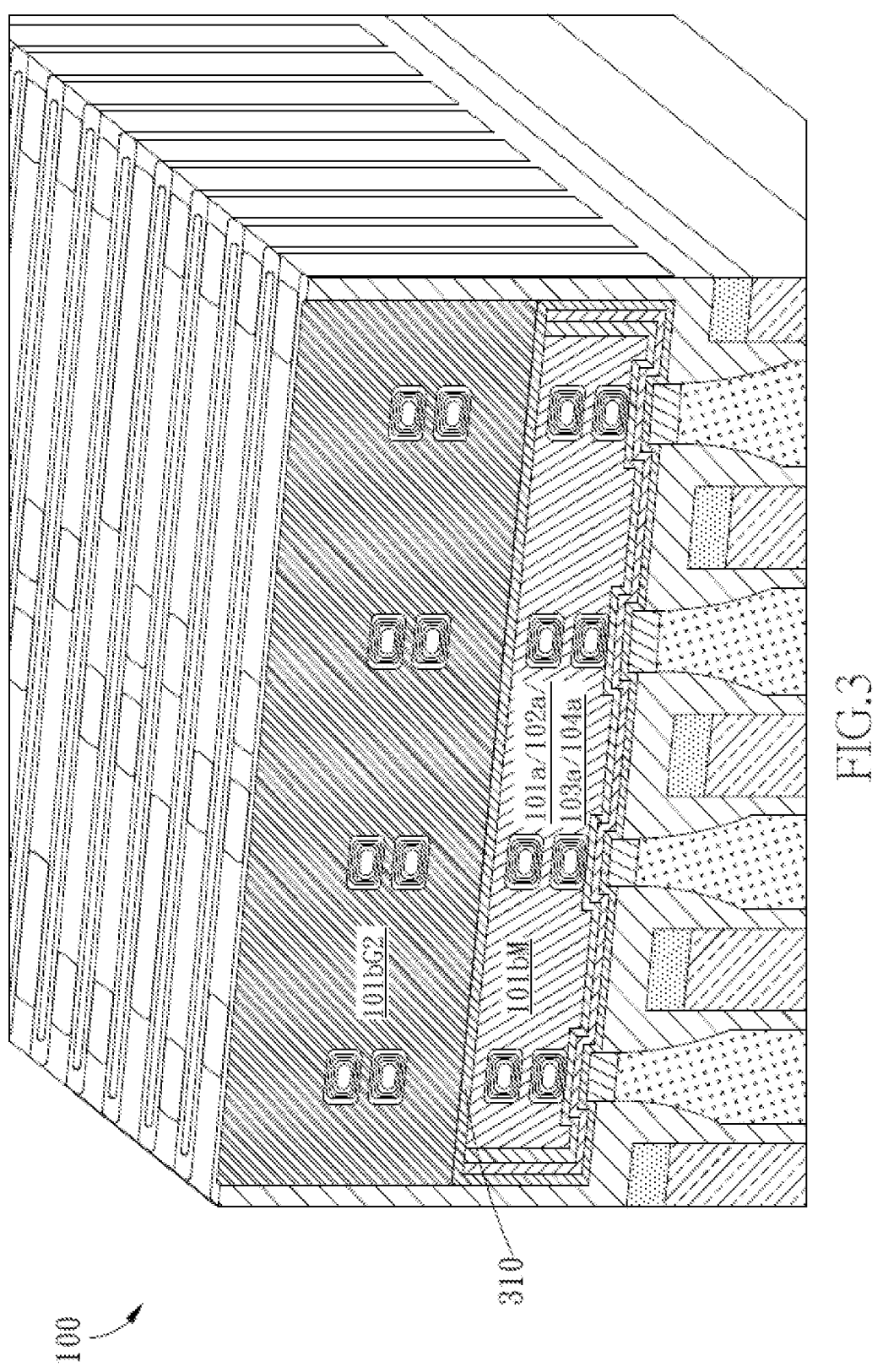

Referring FIG. 3, after cleans are done following the recess of the PMOS gate metal stack, e.g., the first upper gate stack 101bG, from the upper semiconductor devices 101b, 102b, 103b and 104b, it is optional to place a conductive liner or a barrier layer 310 overtop the recessed conductive metal 101bM as a technique to prevent any oxidation of the tungsten of the conductive metal 101bM during the subsequent processing steps in which air-breaks in the down-stream unit processes may be encountered. This step is again optional as technology and processes do exist within Tokyo Electron to remove the tungsten oxide with great selectivity to the high-k layer 101bG2, such as HfO, if for cost or cycle time reasons the option to forego the selective deposition of the conductive liner or barrier layer 310 is chosen. The choice of the conductive liner or barrier layer 310 should meet certain thermal processing restrictions such as the deposition temperature of the conductive liner 310 not exceeding the thermal decomposition temperature of the self-aligned monolayer (SAM) used to promote the selective deposition. Materials such as TaN can be incorporated into this process as the deposition temperature of TaN can be set to be under the thermal decomposition of many commercially available SAM materials.

Figure 4:
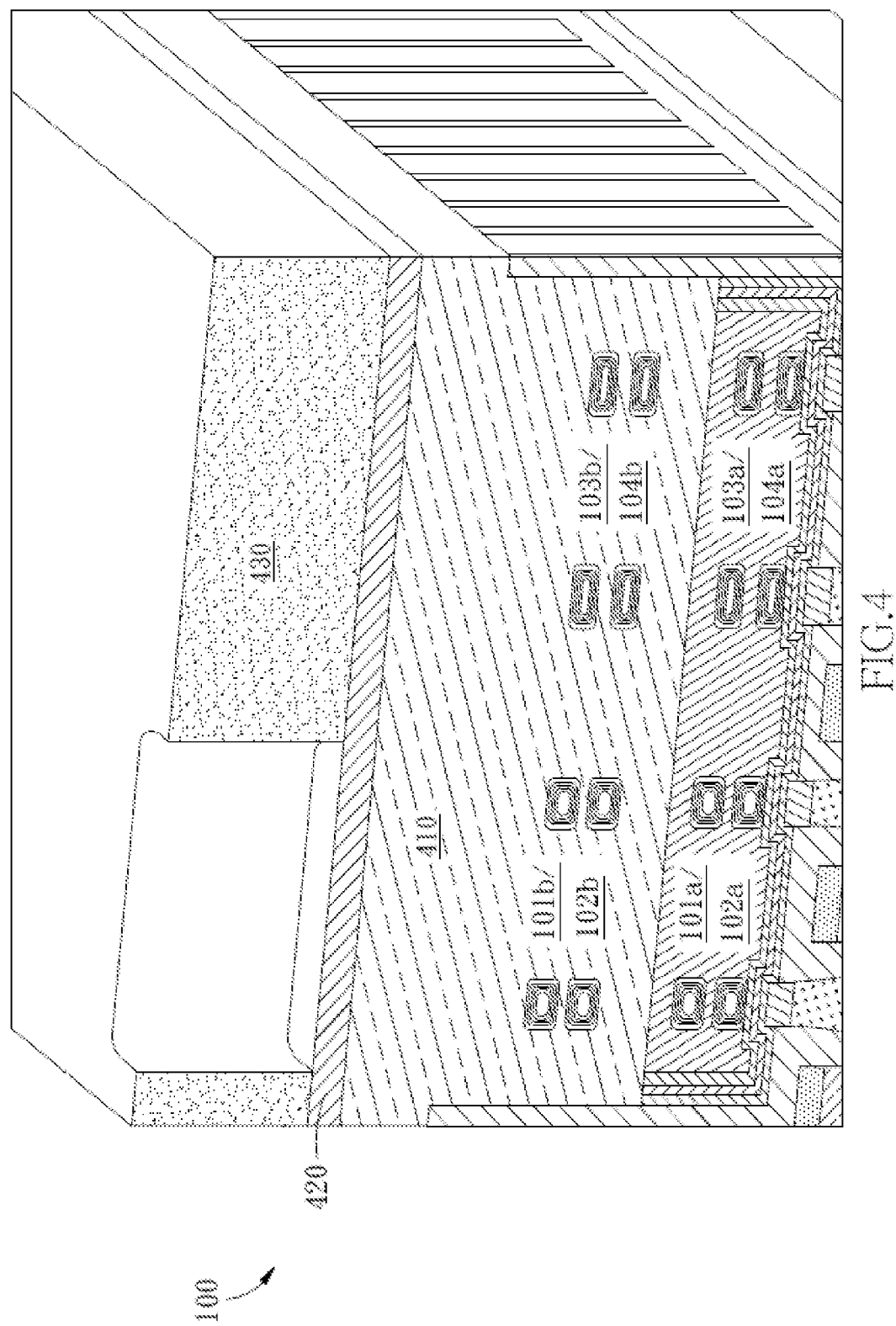

Referring to FIG. 4, the recessed transistor areas, e.g., the upper semiconductor devices 101b, 102b, 103b and 104b with the conductive metal 101bM removed, are then gap-filled with a temporary patterning film (or gap-fill material) 410, such as spin-on-carbon, a resist layer 420 is deposited and formed on the spin-on-carbon 410, and an etch mask 430 defining an intended electrical isolation, e.g., an intended split gate region 510 (shown in FIGS. 5 and 6), between the lower semiconductor devices 101a and 102a and the upper semiconductor devices 101b and 102b is generated and covers the resist layer 420.

Figure 5:
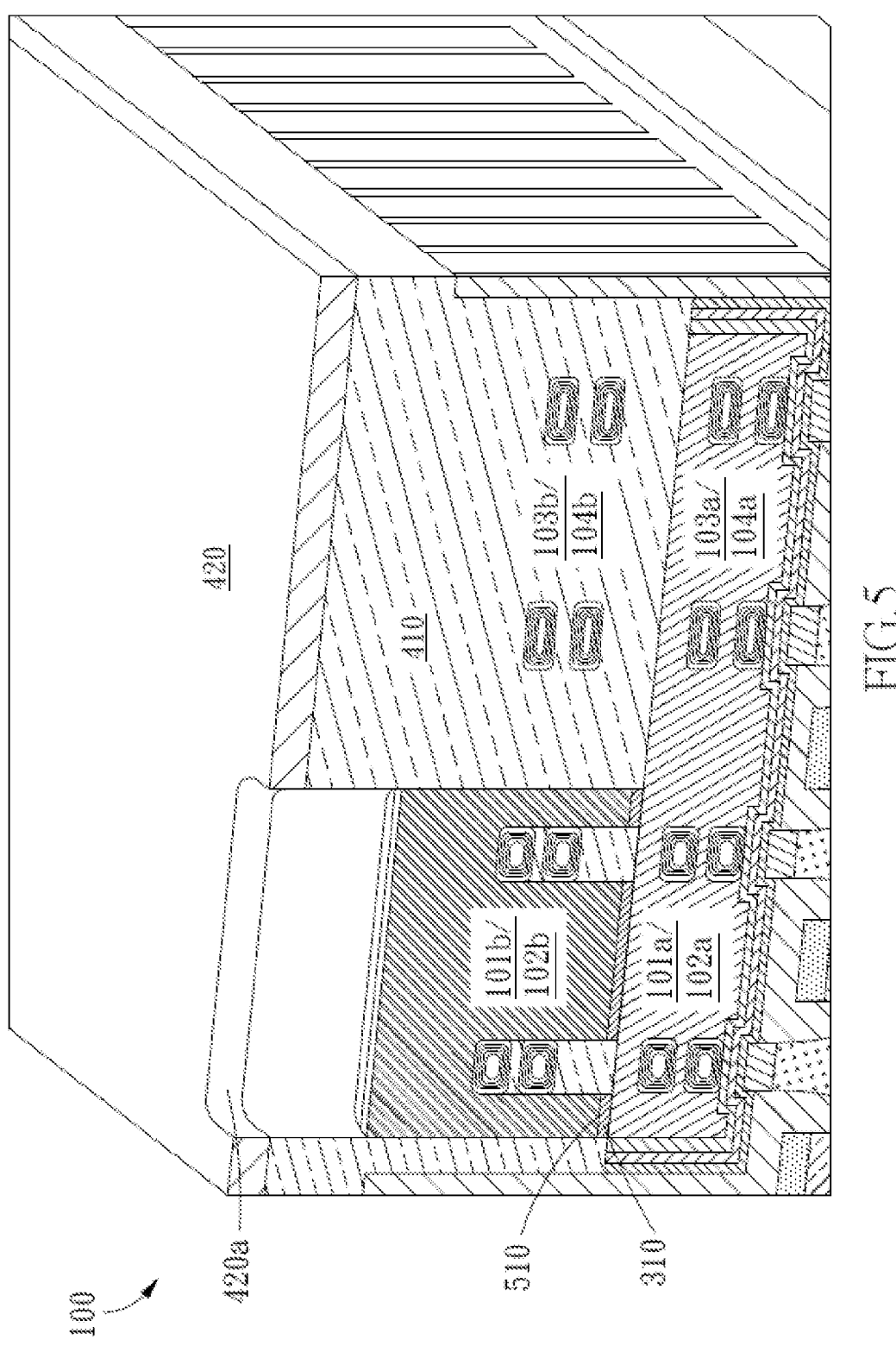
Figure 6:
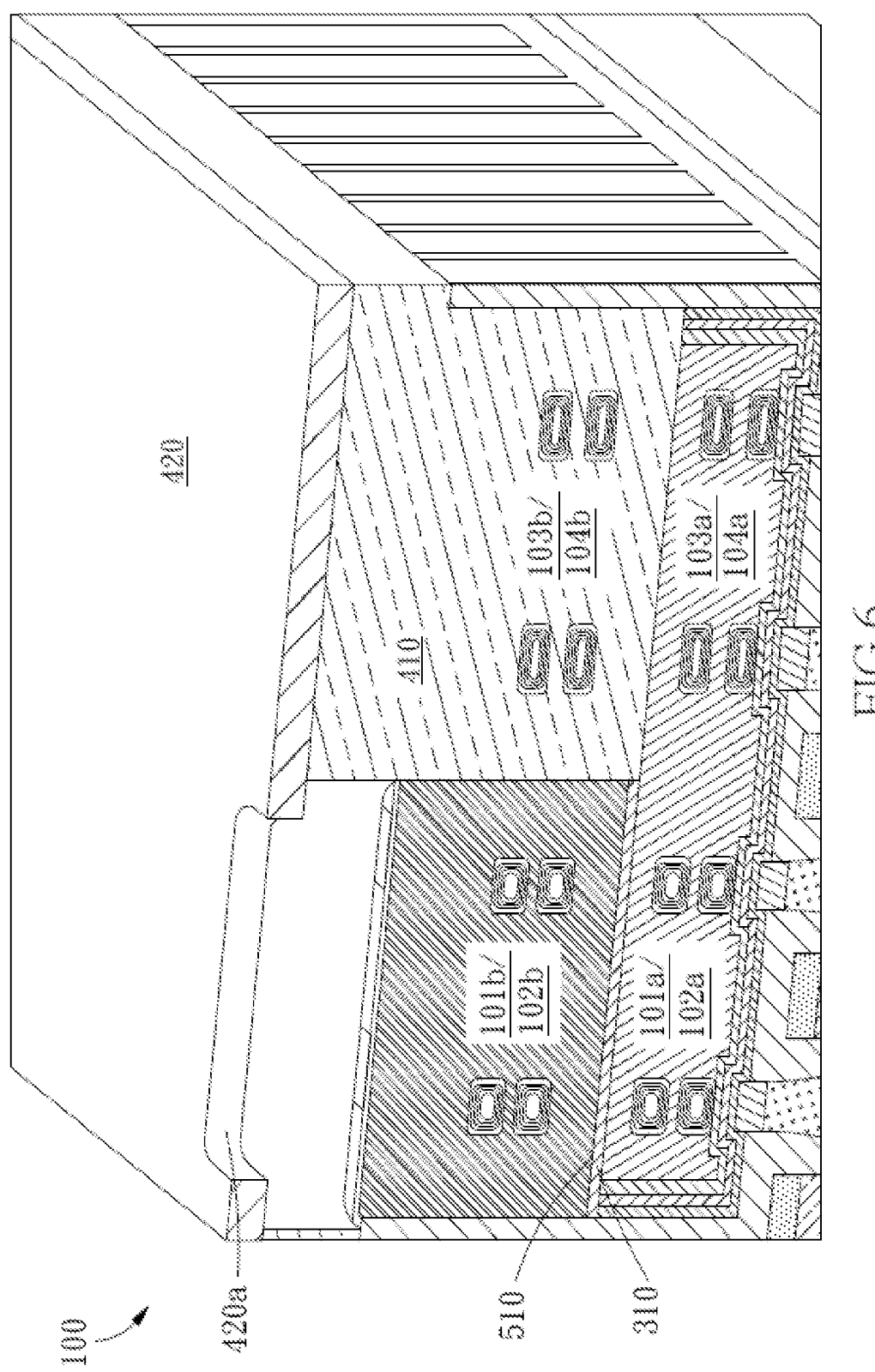

Referring to FIGS. 5 and 6, the etch mask 430 (shown in FIG. 4) is removed, and the pattern transfer of the intended split gate region 510 needs to ensure that the pattern transfer is anisotropic in nature in order to define a discreet region of an interface between the lower semiconductor devices 101a and 102a and the upper semiconductor devices 101b and 102b on which to form isolation dielectric 710 (shown in FIGS. 7 and 8), but also to be able to remove the gap-fill material 410, e.g., the spin-on-carbon, in the regions between the extending nanosheet channels. This can be accomplished through multiple processing steps where at first an anisotropic etch is used to open the intended split gate region 510, as shown in FIG. 5, and then a follow-up isotropic etch is used to remove the gap-fill material 410 from the areas that are blocked in the anisotropic etch by the extending nanosheets of the upper semiconductor devices 101b and 102b. Note that when a combination of anisotropic and isotropic etches are incorporated, the isotropic etch will not only remove the gap-fill material 410 blocked by the extending nanosheets, but will likewise extend the size of a masking region 420a of the resist layer 420, as shown in FIG. 6. In order to compensate for the growth of the intended split gate masking pattern, the intented split gate region 510 is purposely biased in order to account for the subsequent growth of the masking pattern during the isotropic portions of the etch process sequence.

Figure 7:
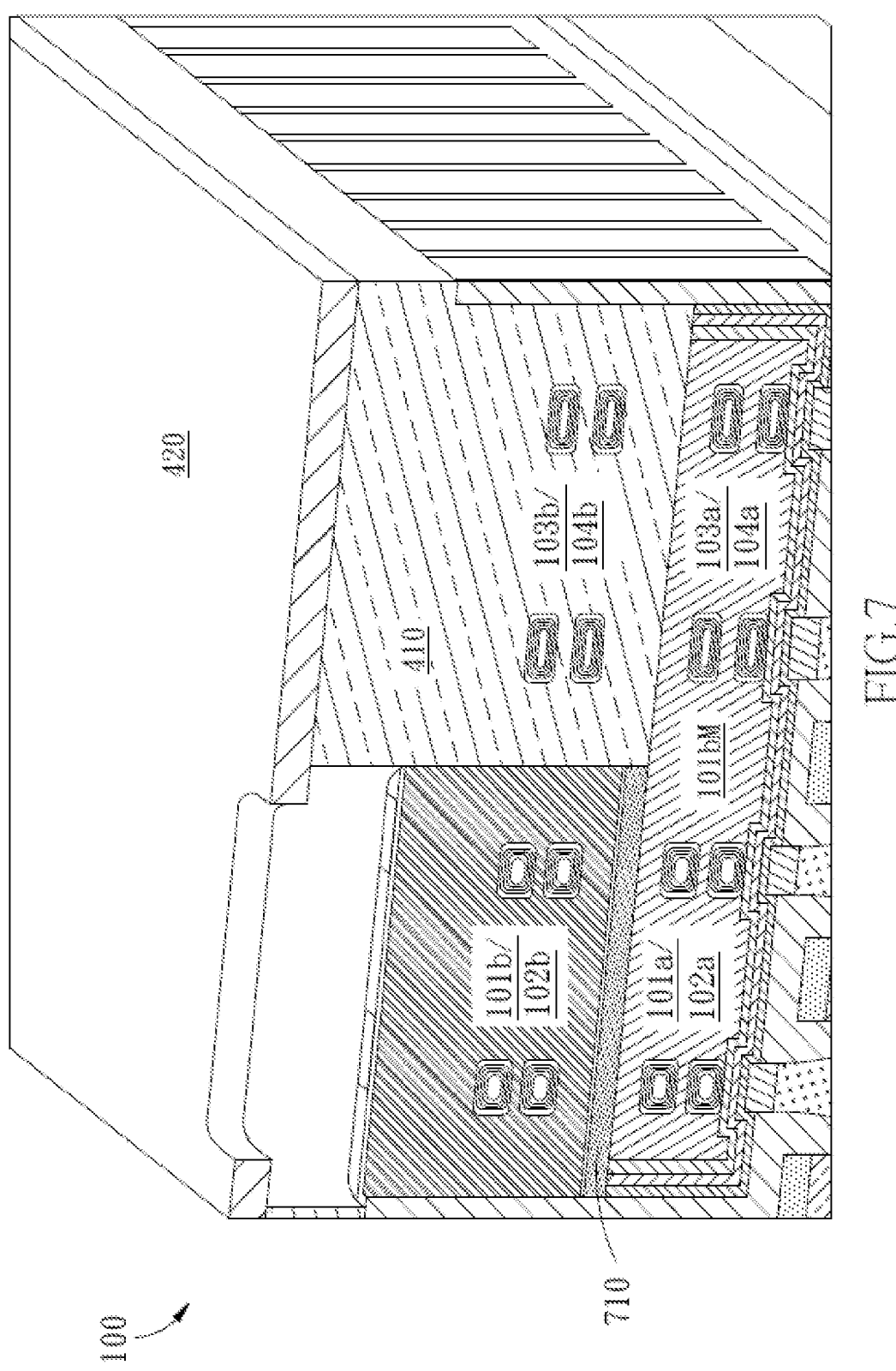

Referring to FIG. 7, after any post-etch cleaning and any required surface preparation of the exposed conductive liner or barrier layer 310 (shown in FIG. 6) from the lower semiconductor devices 101a and 102a, a selective deposition process is used to deposit the isolation dielectric 710, which will form the electrical split between the lower semiconductor devices 101a and 102a, e.g., PMOSs, and the upper semiconductor devices 101b and 102b, e.g., NMOSs. In an embodiment, the selective deposition process can typically involve the deposition of self-assembled mono-layer (SAM) materials which will selectively attach to the exposed dielectrics, e.g., the temporary gap-fill material 410 and the resist layer 420, within the current structure but not to any conductive metal layers such as the recessed tungsten 101bM and the recessed work function metals. In the example embodiment, the selective deposition process in this step is able to support several features. One feature is deposition of the isolation dielectric 710 does not exceed the thermal decomposition temperature of the SAM molecules which can be as high as 375° C. Another feature is the deposition process for the isolation dielectric 710 does not incorporate any plasma processing or oxidizing radicals which can impact the exposed surface of the conductive metal in the recessed lower HKMGs. Another feature is that the quality of the deposition is such that the upper semiconductor devices 101b and 102b and the lower semiconductor devices 101a and 102a will be electrically isolated from one another and that the isolation dielectric 710 can be strong enough to act as an etch stop in down-stream integration processes. Tokyo Electron produces such types of isolation dielectric deposition processes which meet these criteria and can (a) be deposited at room temperature, (b) require no oxidation processes, (c) be plasma-free deposition, and (d) the quality of the isolation dielectric 710 is similar to what would be seen in plasma enhanced CVD processes.

Figure 8:
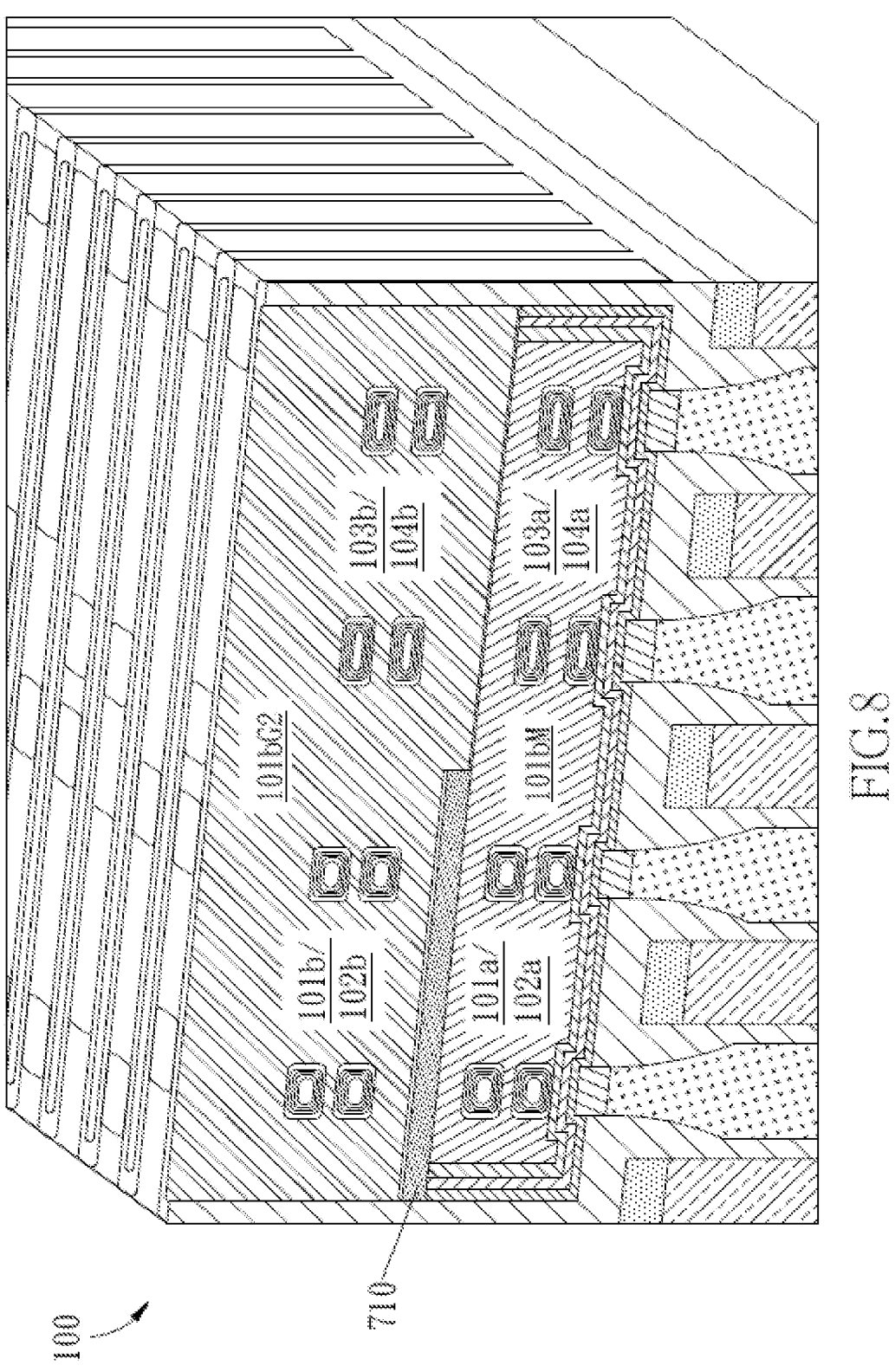

Referring to FIG. 8, after the deposition of the isolation dielectric 710, the temporary gap-fill material 410 (shown in FIG. 7) incorporated in the patterning process can be removed. It can be stressed here that this example shows an "additive method" of depositing the isolation dielectric 710. It is also possible to have an integration in which the isolation dielectric 710 is grown across the entire face of the recessed conductive metal 101bM (or the conductive liner or barrier layer 310, as shown in FIG. 3) and the patterning mask used is of opposite polarity where the regions where common gates (i.e., where NMOS and PMOS gates are electrically connected to one another, e.g., the lower semiconductor devices 103a and 104a and the upper semiconductor devices 103b and 104b) are desired are done so through the removal of the isolation dielectric 710.

Figure 9:
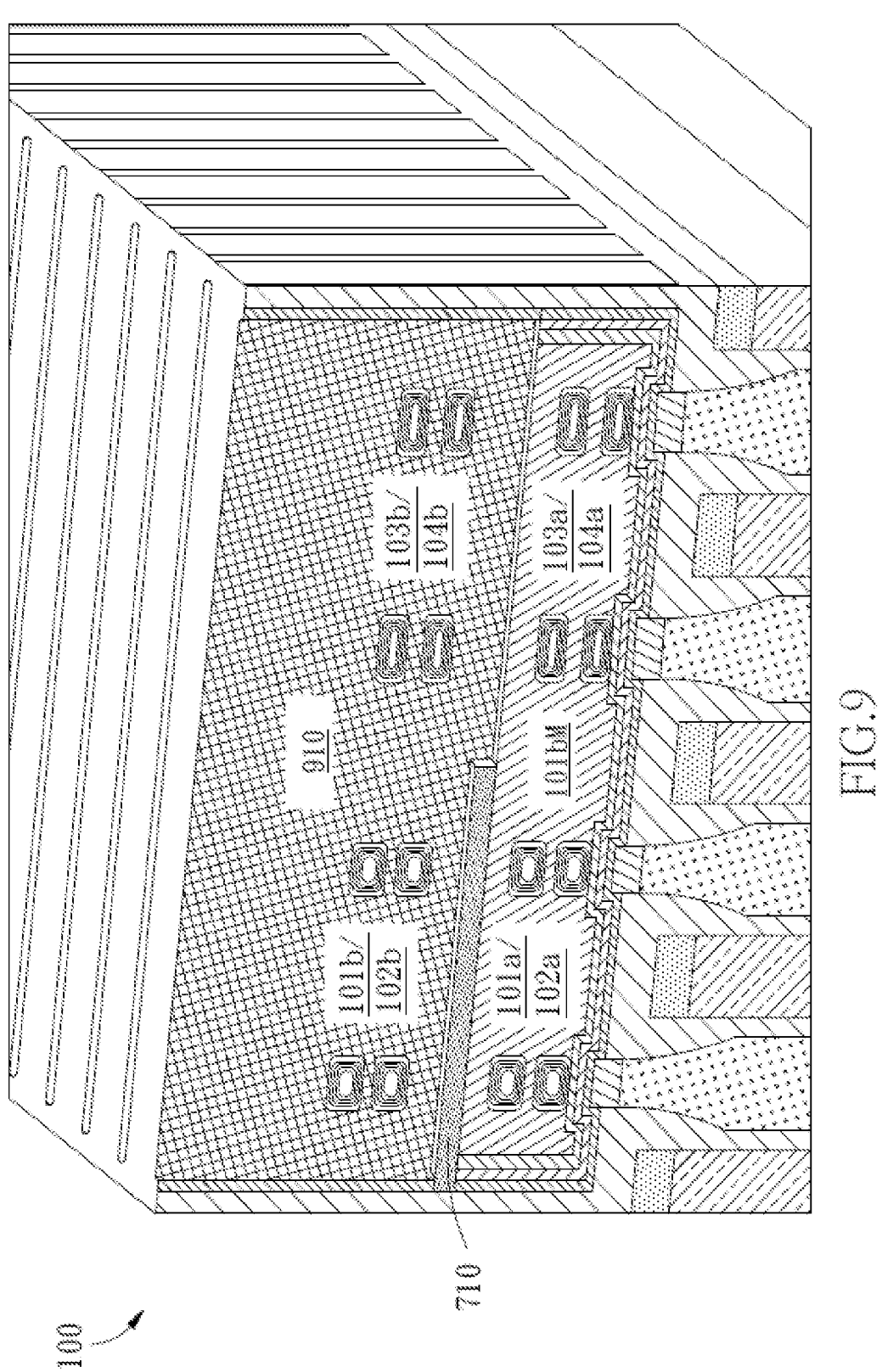

Referring to FIG. 9, the work function metallization, e.g., NWFM and conductive TiN liner 910, of the upper semiconductor devices 101b, 102b, 103b and 104b, e.g., NMOSs, can be done within the opened gate structure, which is generated after the temporary gap-fill material 410 (shown in FIGS. 5 to 7) is etched and removed. In an embodiment, the NWFM 910 can be deposited by atomic layer deposition (ALD). In the example embodiment, the NWFM 910 of the gate stacks of the upper semiconductor devices 102b, 103b and 104b include TiAl. The isolation dielectric 710 will form the split gates separating NMOSs and PMOSs from regions where individual input to each of the complementary transistors is needed within the standard cell, e.g., the upper semiconductor devices 101b and 102b and the lower semiconductor devices 101a and 102a. In areas where there is no isolation dielectric formed, e.g., areas between the lower semiconductor devices 103a and 104a and the upper semiconductor devices 103b and 104b, the NMOS metals will be deposited on top of the recessed PMOS HKMG transistor forming a common gate.

Figure 10:
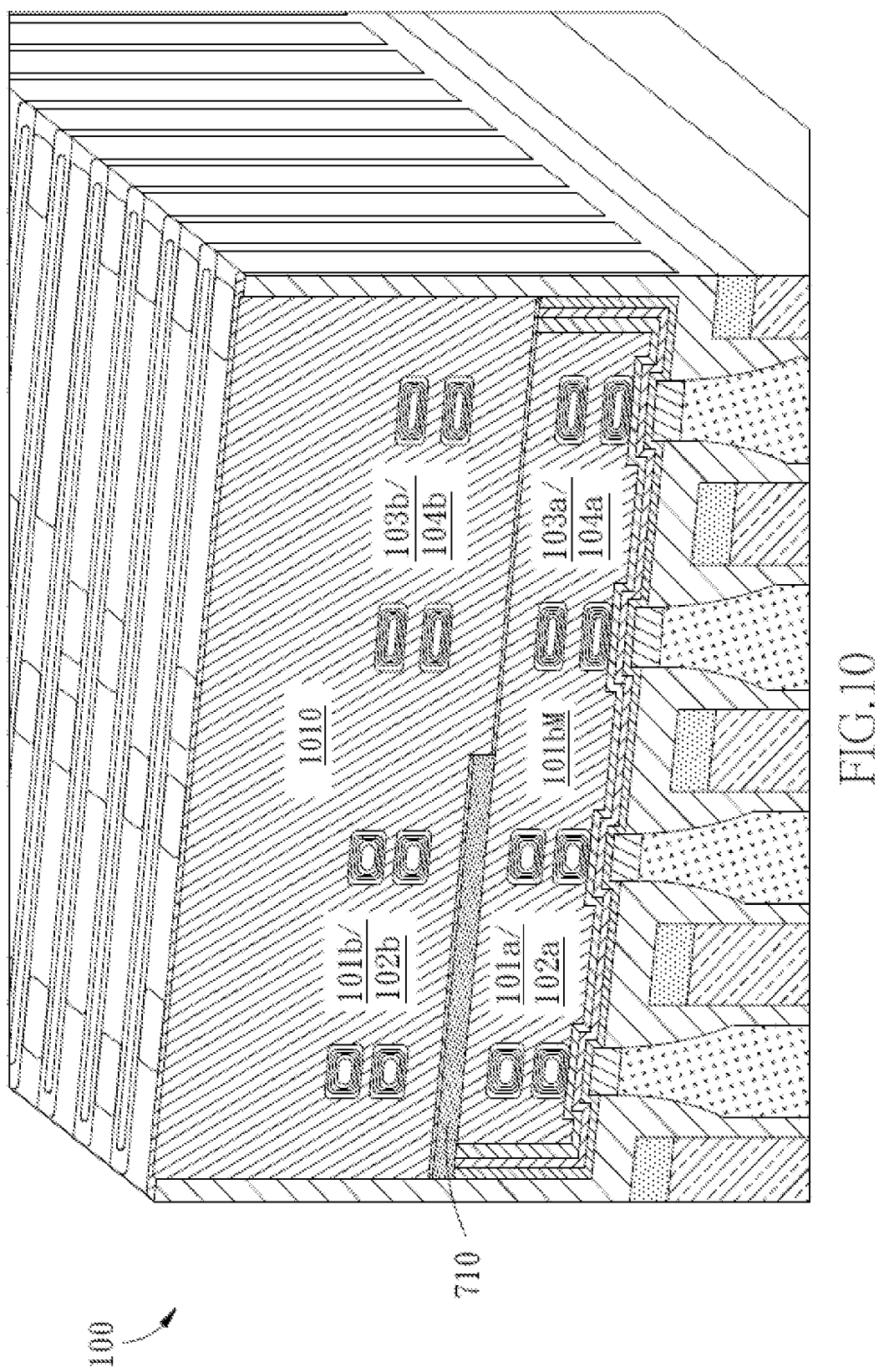

Referring to FIG. 10, after the NWFM and conductive TiN liner 910 (shown in FIG. 9) deposition, the gate structure is then filled with the highly conductive metal 1010 such as tungsten to complete the HKMG metallization process of the upper semiconductor devices 101b, 102b, 103b and 104b.

Figure 11:
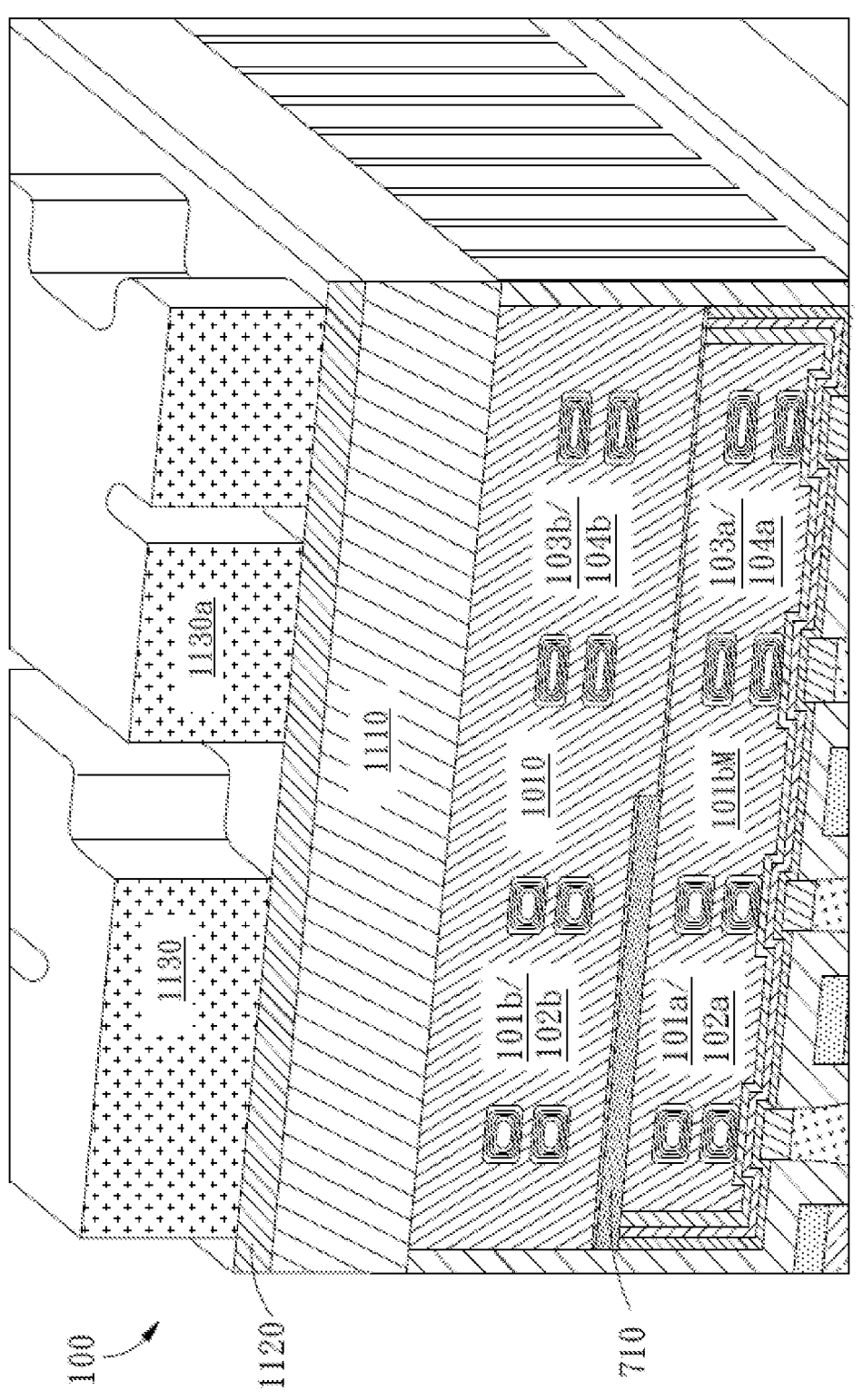

Referring to FIG. 11, a lithographic patterning stack is then deposited over the finished HKMG stacked transistors, e.g., the semiconductor structure 100 shown in FIG. 10, and an HKMG cut-last pattern 1130a is generated. For example, the semiconductor structure 100 shown in FIG. 10 is covered with a temporary patterning film 1110, such as spin-on-carbon, a resist layer 1120 is deposited and formed on the spin-on-carbon 1110, and an etch mask 1130 defining the HKMG cut-last pattern 1130a is generated and covers the resist layer 1120. The intent of the cut is to place separation dielectric 1310 (shown in FIG. 13) between gates across different standard cells. In some CFET integrations where double-row height standard cells are implemented, the HKMG cut-last pattern 1130a can likewise for separation dielectric to be formed between any two NMOS gates and/or any two PMOS gates within the double-row height standard cell, similar to making the isolation between any two standard cells.

Figure 12:
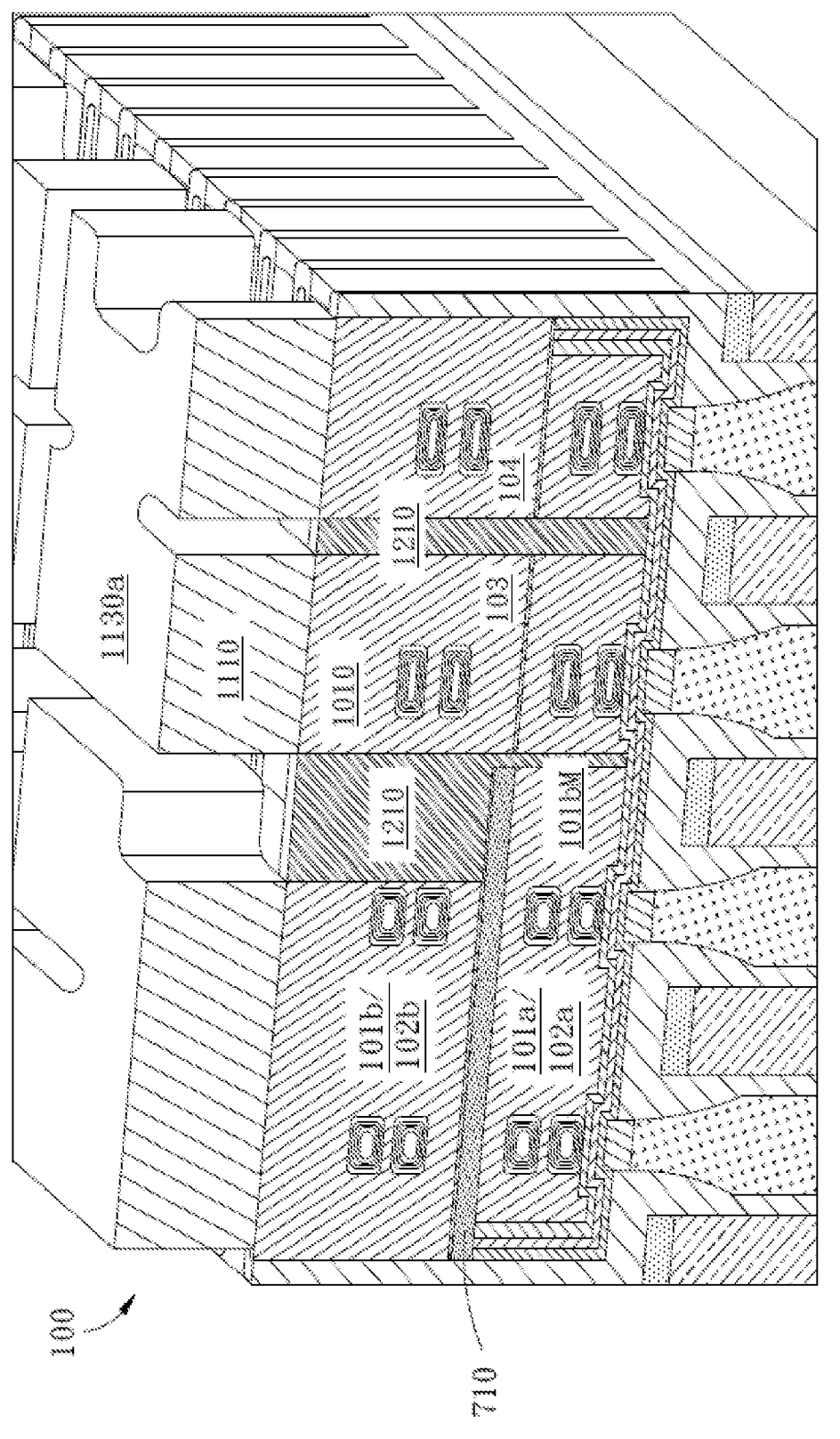

Referring to FIG. 12, the HKMG cut-last pattern 1130a is then transferred through the patterning stack into the HKMG (i.e., the semiconductor structure 100 shown in FIG. 10) itself, where the semiconductor structure 100 will be etched and cut anisotropically through the tungsten 1010 and 101bM and any HKMG stack films that are not covered by the HKMG cut-last pattern 1130a and be blocked from further etching when the split gate isolation dielectric 710 is revealed, which can act as an etch stop, to form cut areas 1210. The size of the split gate isolation dielectric 710 and the subsequent HKMG cut-last mask are such that the cut mask will exceed the length of the split gate isolation mask such that HKMG cut-last transfers can extend beyond the total length of the split gate isolation dielectric 710 so that HKMG cuts can be made within the PMOS transistors to isolate standard cells from one another without impacting the formation of the split gates of the upper semiconductor devices 101b and 102b and the lower semiconductor devices 101a and 102a. The size of the split gate isolation dielectric 710 and the subsequent HKMG cut-last mask are also such that the patterning of the split gate isolation dielectric 710 and the HKMG cut-last masks include stair-casing of the subsequent formed split PMOS and NMOS transistors, e.g., the lower semiconductor devices 101a and 102a and the upper semiconductor devices 101b and 102b, so that individual electrical inputs to both split gates can be provided separately.

Figure 13:
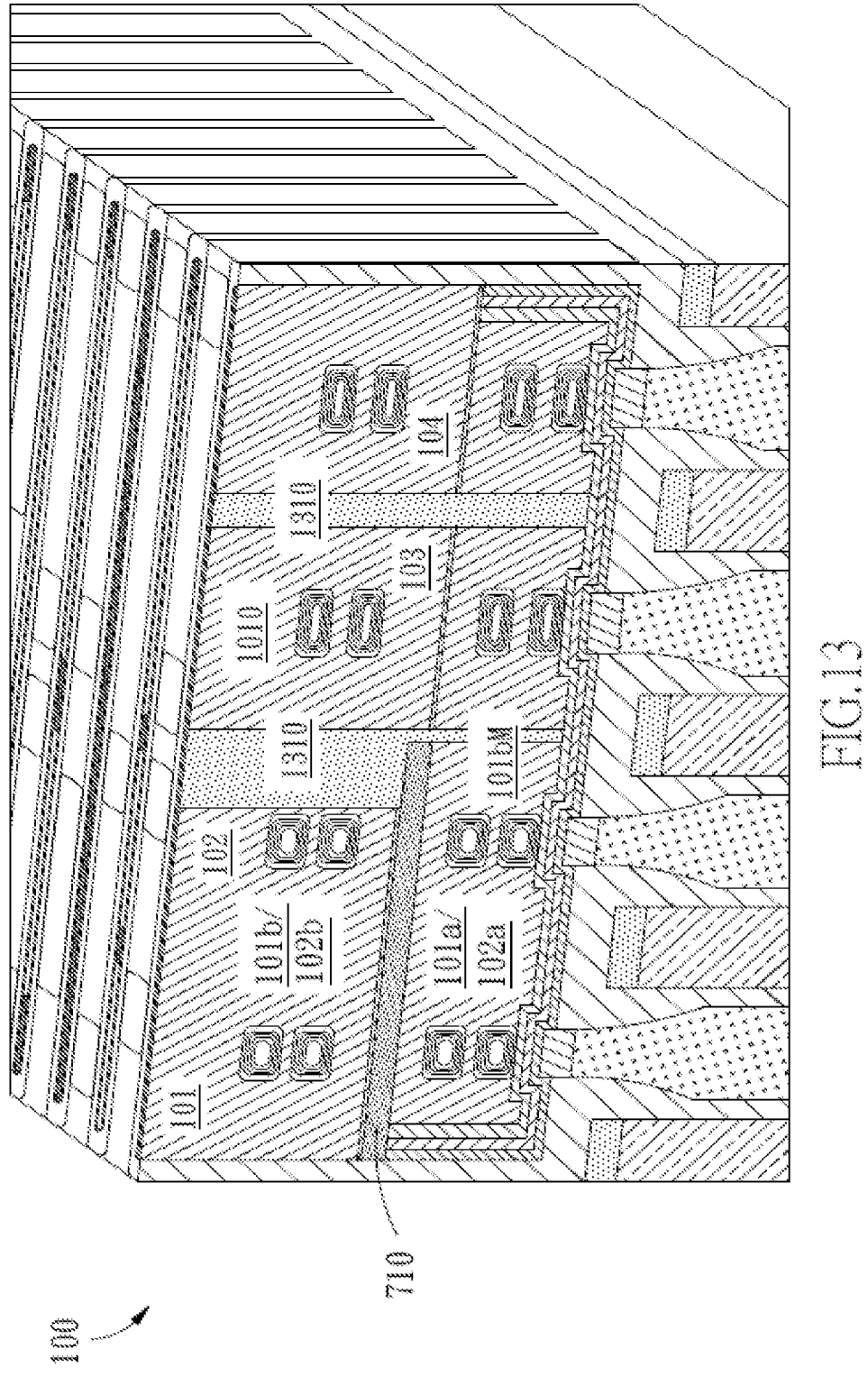

Referring to FIG. 13, the lithographic patterning stack, which includes the spin-on-carbon 1110, the resist layer 1120 and the etch mask 1130 (shown in FIG. 11), is removed, and the cut areas 1210 (shown in FIG. 12) are then filled with a suitable separation dielectric material 1310 (e.g., silicon nitride) in which the over-burden of the deposition can either be easily polished or etched away. In the example embodiment, the separation dielectric 1310 separates the first and second semiconductor stacks 101 and 102, which include split gate semiconductor devices 101a, 101b, 102a and 102b, the third semiconductor stack 103, which includes common gate semiconductor devices 103a and 103b, and the fourth semiconductor stack 104, which includes common gate semiconductor devices 104a and 104b, from one another. The material of the separation dielectric 1310 will be chose based on minimum requirements for dielectric separation between the different standard cells but must also be based on the need to transfer gate input vias from the signal wires down to the lower-tier PMOS transistors selective to the other dielectric which comprised of the low-k gate spacer and the dielectric filling in the contact region as well as the cap materials used for the interconnect. Note that this illustration shows building the HKMG module after the formation of the upper-tier NMOS interconnects. It is completely possible to reverse this integration flow and to form the NMOS contacts first, then proceed to the HKMG module for both NMOS and PMOS and to later form the NMOS interconnect structures. Both approaches are viable and the integration chosen is dependent upon the thermal budgets of the materials being used within the integration.

Figure 14:
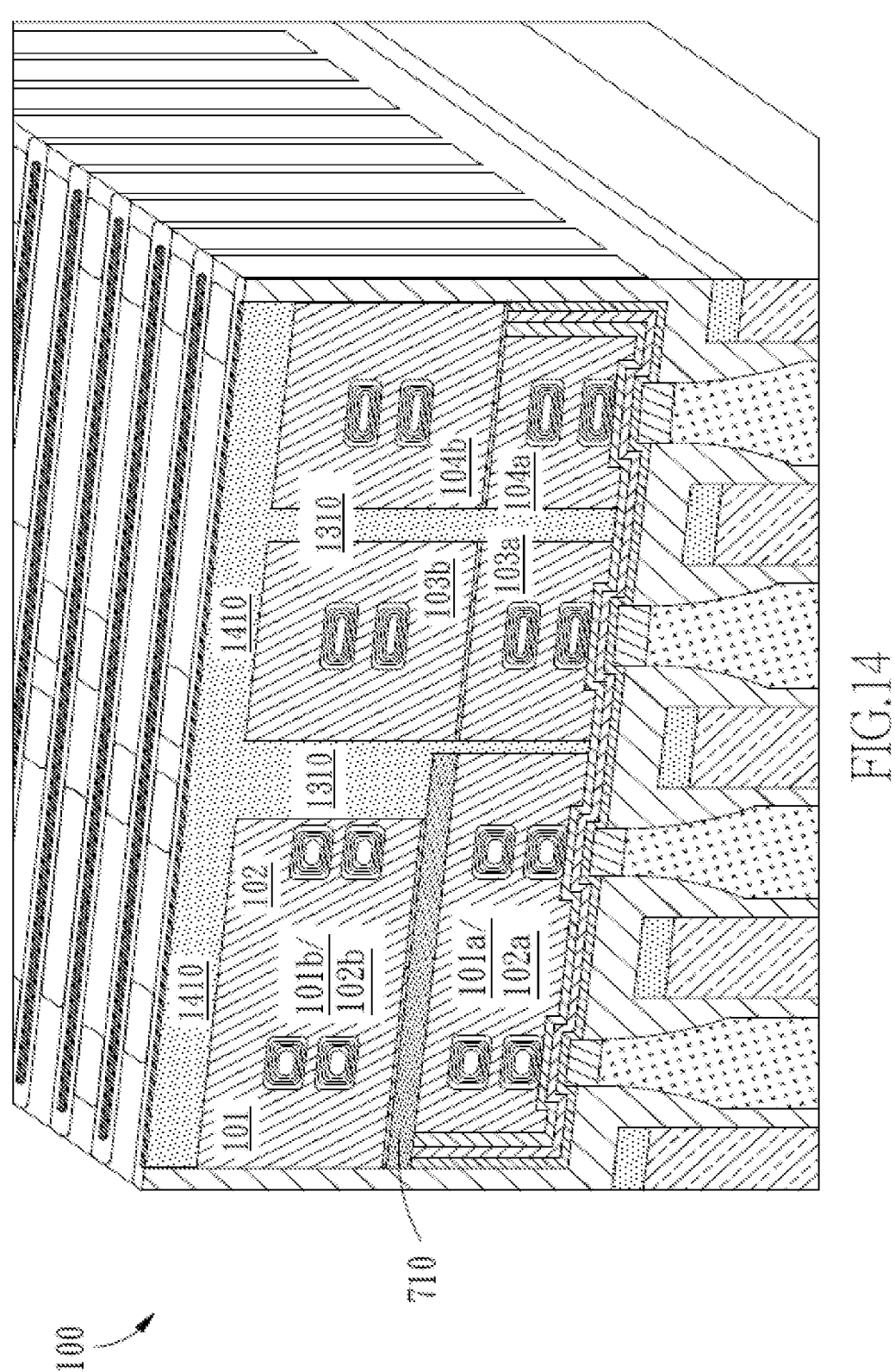

Referring to FIG. 14, the upper semiconductor devices 101b, 102b, 103b and 104b are etch-recessed in order to provide room to place a gate cap 1410 (e.g., silicon nitride). The purpose of the gate cap 1410 is to not only cover the HKMG transistors, e.g., the first to fourth semiconductor stacks 101 to 104, but also to provide some means of etch selectivity for self-aligning via-to-gate as well as via-to-contacts in subsequent manufacturing steps. A suitable gate cap material is then deposited in the room and either polished or etched-back to form the gate cap 1410, which provides a good cross-sections of different types of transistor arrangements. From the left-hand side of FIG. 14, a split gate is formed where the isolation dielectric 710 has been formed between the upper-tier NMOS transistors, e.g., the upper semiconductor devices 101b and 102b, and the lower-tier PMOS transistors, e.g., the lower semiconductor devices 101a and 102a; and where the length of the lower-tier PMOS transistors is extended relative to the upper-tier NMOS transistors in order to provide pin access for unique input connection to the lower-tier PMOS transistors. To the right of the split gate are two common gate CFETs in which NMOS transistors, e.g., the upper semiconductor devices 103b and 104b, and PMOS transistors, e.g., the lower semiconductor device 103a and 104a, are electrically connected together. In these cases, no stair-casing of the gate sizes are needed because a common input connection can be made to both gates by contacting only the upper-tier transistor.

Figure 15:
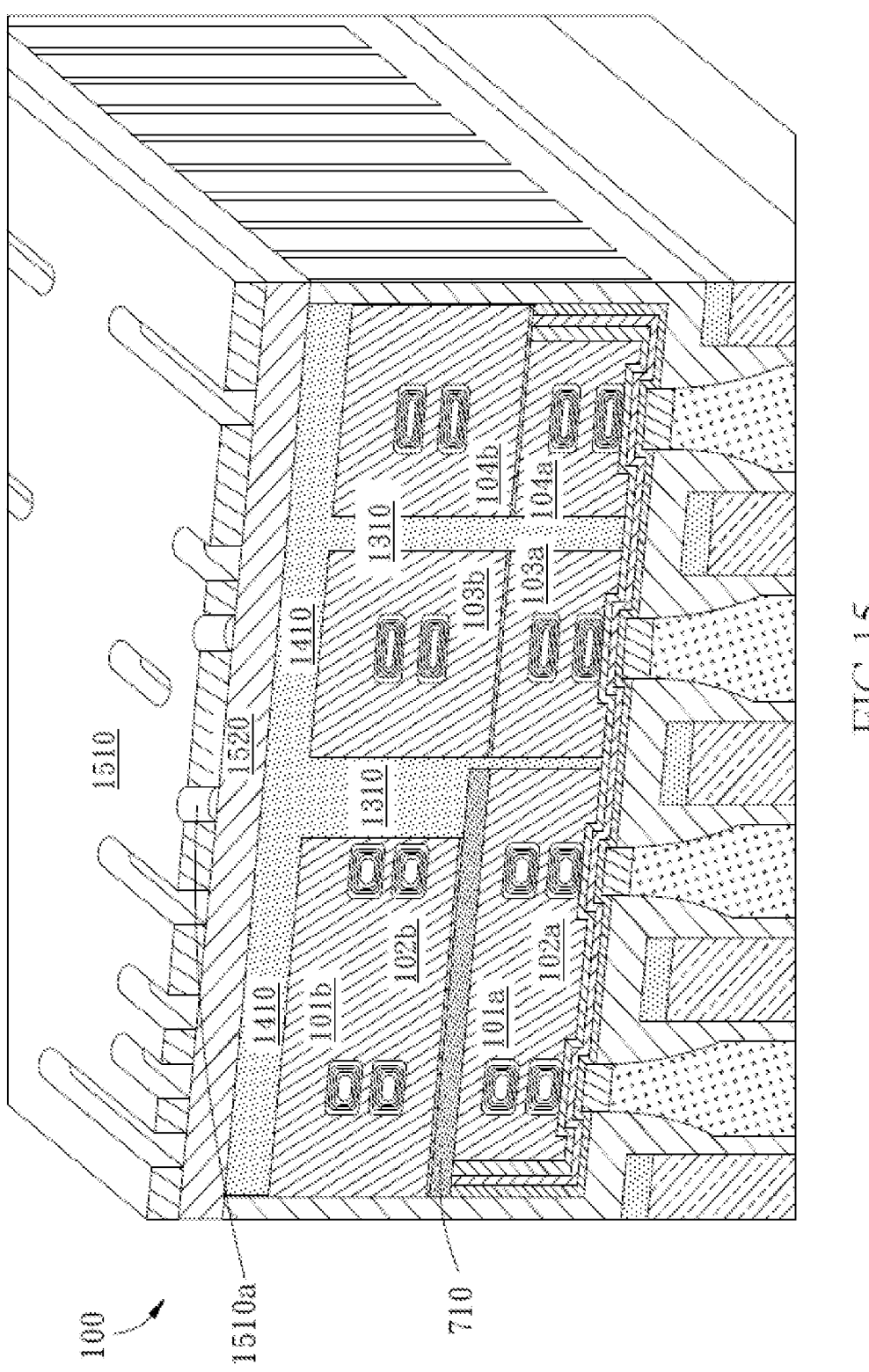

Referring to FIG. 15, an M0 metal pattern 1510 is memorized into a hardmask layer 1520 (e.g., the low-k BEOL dielectric film stack) such as TiN, which is formed over the semiconductor structure 100 shown in FIG. 14. For the case of the split gate, it can be seen that one of the M0 signal tracks, e.g., an M0 signal track 1510a, is positioned directly above the region in which the stair-case exists between the NMOS 102b and the PMOS 102a.

Figure 16:
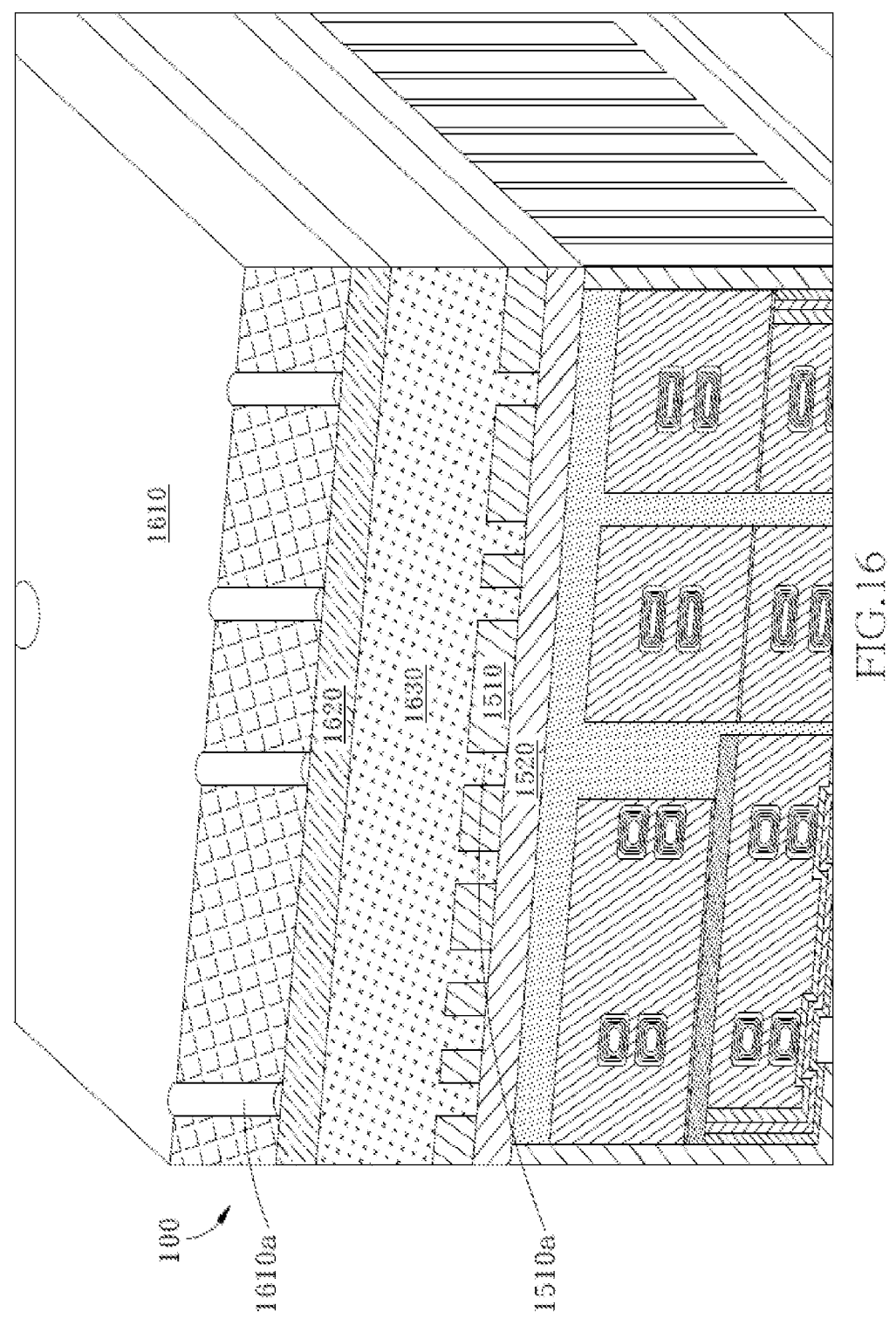

Referring to FIG. 16, gate input via connections are lithographically patterned. For example, a gate input via connection pattern 1610 including multiple gate input vias 1610a is memorized into a hardmask layer 1620 such as TiN, which is formed on a gap-fill material 1630, such as low-k dielectric, which fills the M0 signal tracks 1510a.

Figure 17:
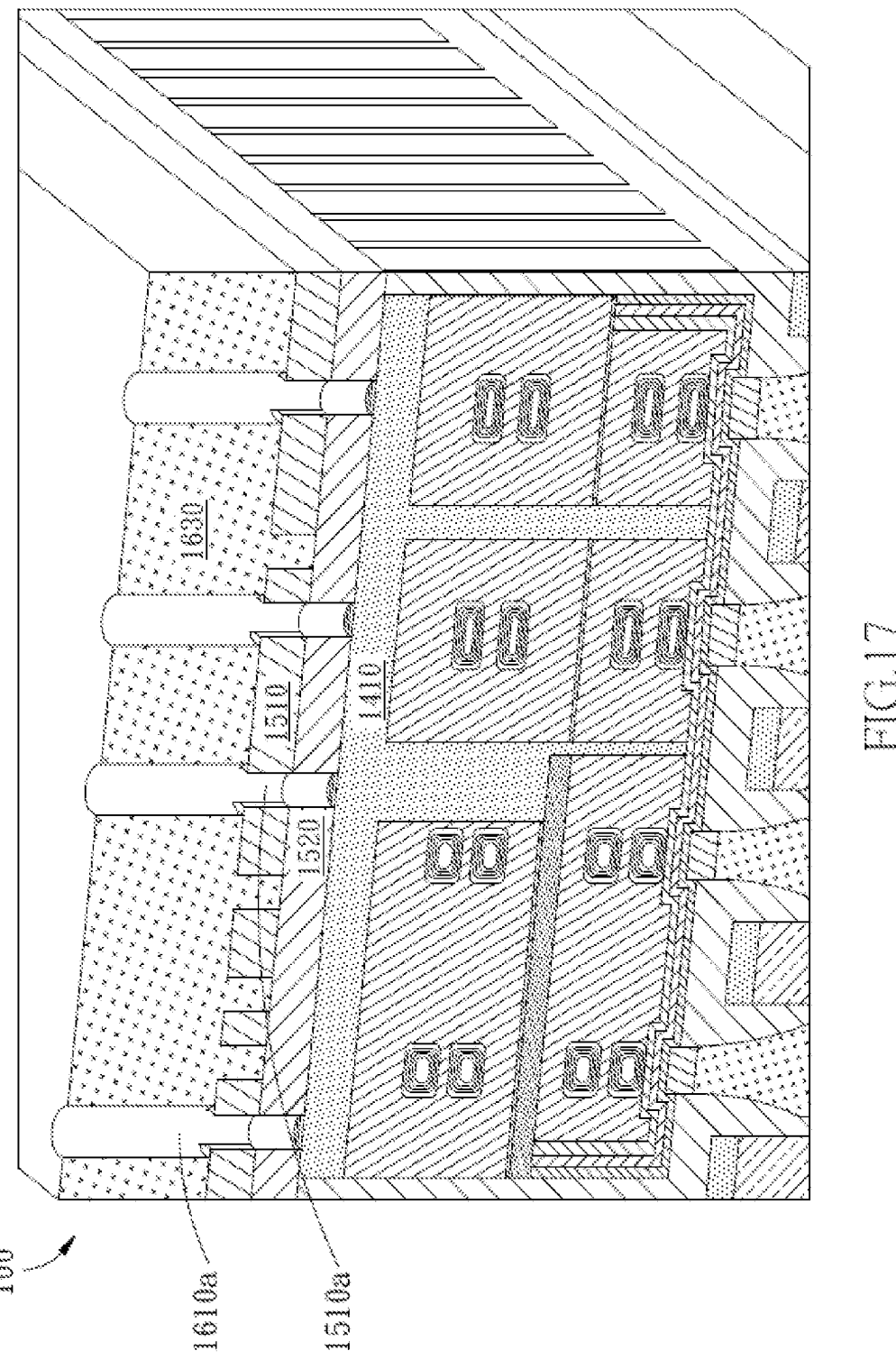

Referring to FIG. 17, the gate input vias 1610a are then transferred through the lithography patterning stack and the transfer etch lands on the exposed low-k back-end-of-line (BEOL) dielectric 1520. The gate input vias 1610a can be self-aligned to the M0 tracks 1510a memorized within the TiN hardmask layer 1520 in one orientation and will be self-aligned in the another orientation by means of etch selectivity differences between the gate cap 1410, the gate low-k spacer, the pre-metal dielectric (PMD) within the contact and interconnect region, and the cap materials which have been deposited overtop the metal interconnects. Variations in both material selection can be made to better promote this self alignment and likewise, and changes in the integration structures can also be used. For example, in the interconnect region, instead of having a filled PMD dielectric isolated by pockets of an etch selective cap material used over the interconnect metal, it can be posed that a process by which the entire PMD dielectric is recessed into the interconnect region and then re-filled with similar type of etch-selective material, similar to how the gate cap is formed. The gate input vias 1610a are further etched into the low-k BEOL dielectric film stack 1520 with landing on the silicon nitride gate cap 1410.

Figure 18:
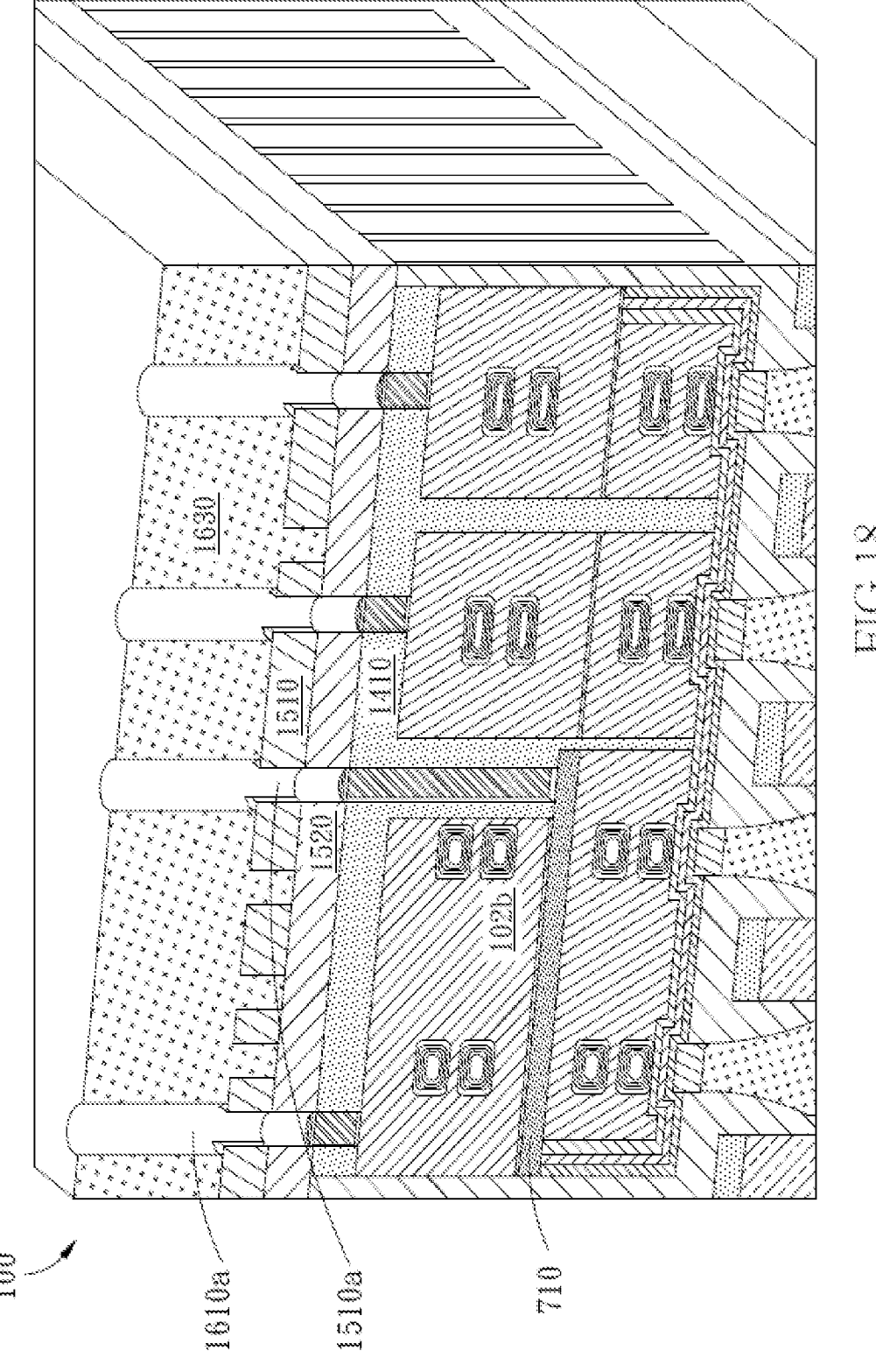

Referring to FIG. 18, the etch process is then transitioned over from an oxide etch to a silicon nitride etch process. Given the difference in binding energies between silicon nitride and silicon oxide, the silicon nitride gate cap 1410 is etched to open the upper-tier NMOS transistors, e.g., the second upper semiconductor device 102b, as well as the continuation of the input via etch to reach the split gate isolation dielectric 710. If different dielectric materials are used between the gate cap 1410 and the split gate isolation dielectric 710, the silicon nitride etch to extend the gate input via down to the lower-tier device will land on the split gate isolation dielectric 710. In this case, the formed via-to-contacts are already formed and transferred into the PMD dielectric, but have been filled with the lithography patterning gap-fill material which prevents any further over-etch of these via-to-contacts. According to the present disclosure, in order to enable split-gate configurations in aggressively scaled CFET layouts, the device width is selectively narrowed, e.g. where necessary to open up the separation space for lower gate contacts to reach and past the end of the upper gate. For example, the split gate CFET, e.g., the semiconductor devices 1011, 101b, 102a and 102b has a device width (channel width) reduced in order for the lower gate contact to reach and past the end of the upper gate.

Figure 19:
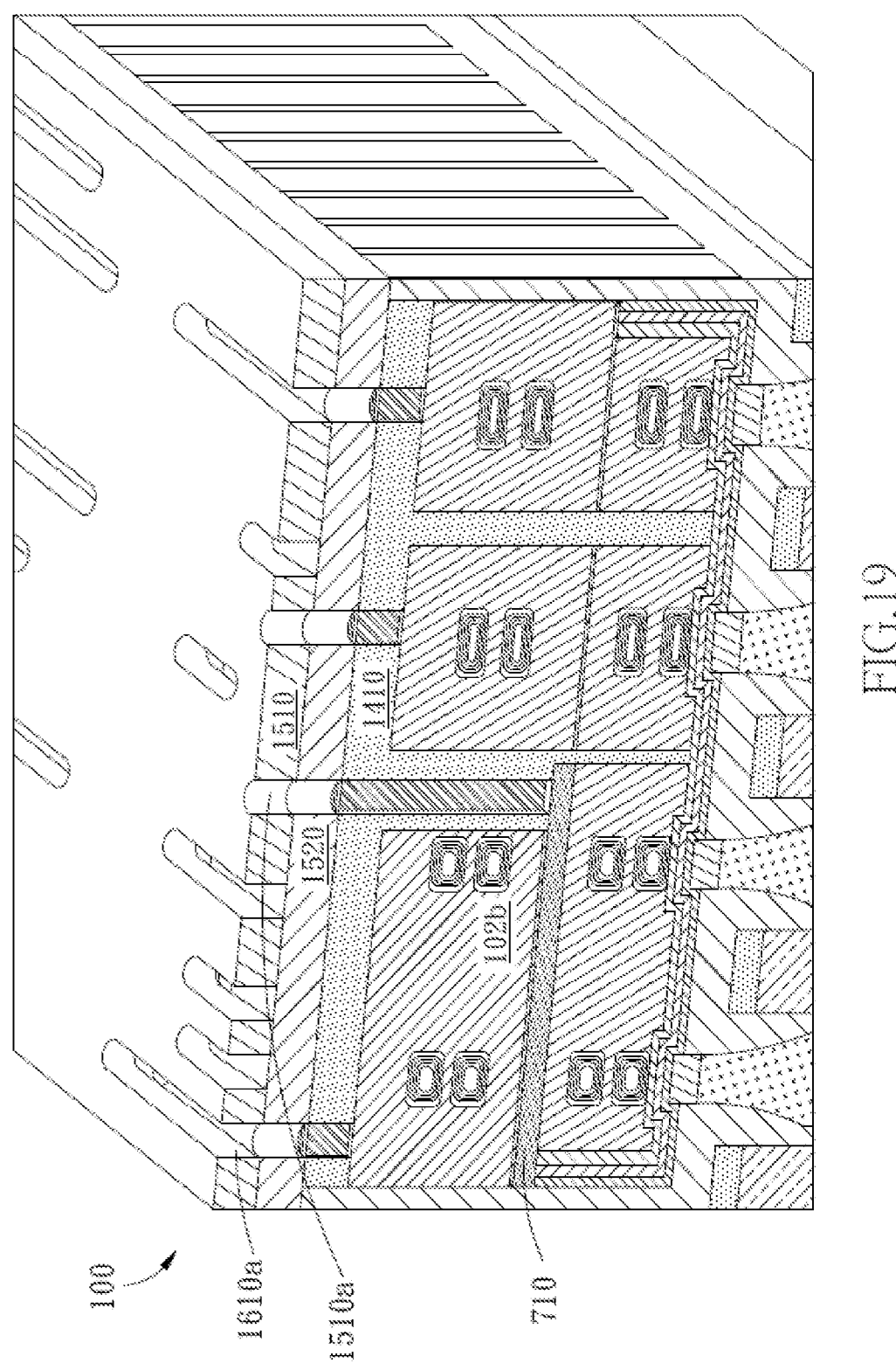

Referring to FIG. 19, the lithography patterning stack is then removed to reveal the memorized M0 metal pattern 1510a in the TiN hardmask layer 1520, which will be overtop the low-k dielectric gate cap 1410. If the choice of the split gate isolation dielectric 710 is silicon oxide, then a single etch step can be used to accomplish two tasks: (1) opening of the split gate isolation dielectric 710 over the lower-tier transistor, and (2) transfer of the M0 metal pattern to the low-k BEOL dielectric 1520 as is common with dual damascene integrations.

Figure 20:
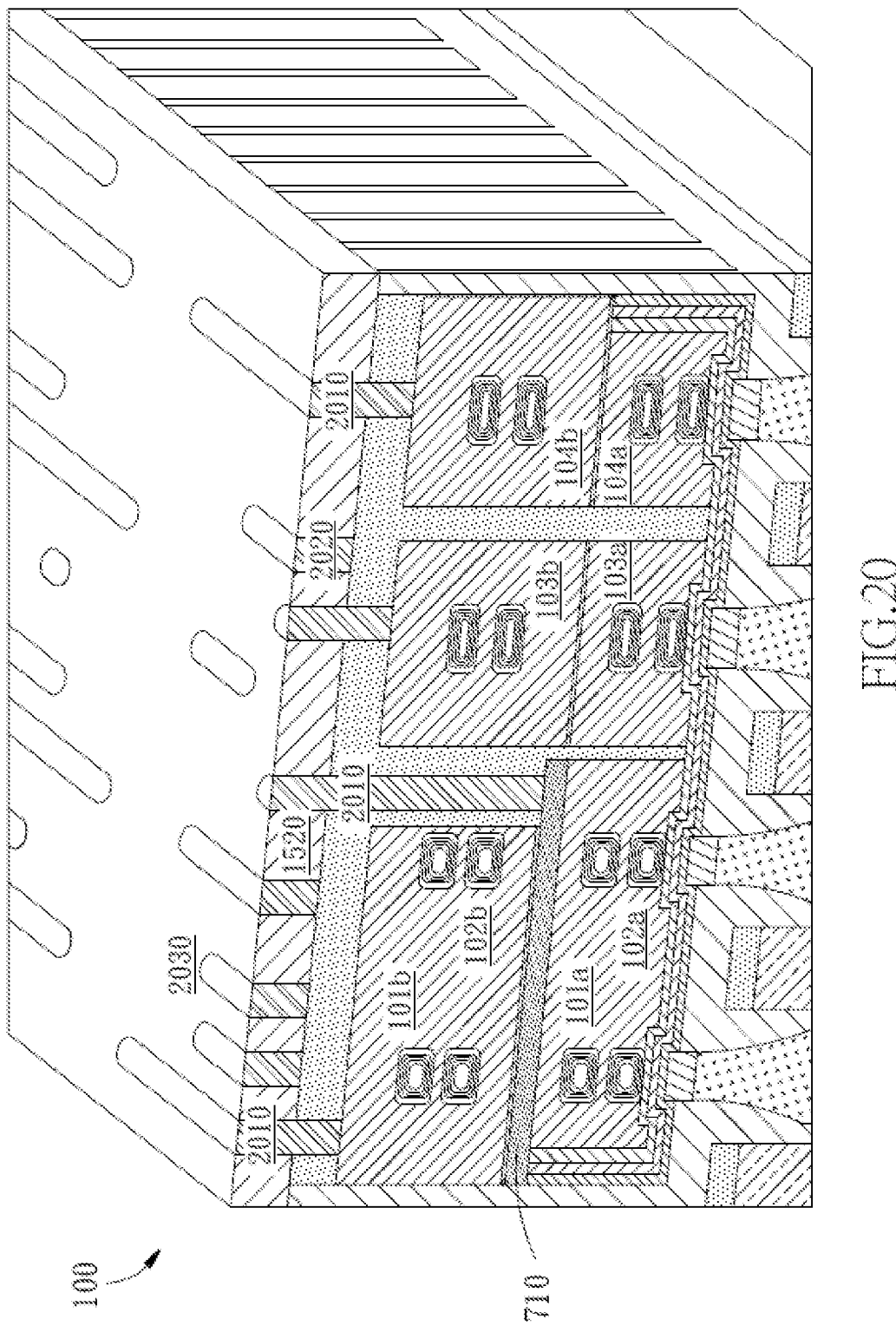

Referring to FIG. 20, the via-to-gates 2010, via-to-contacts, and M0 metal tracks 2030 are metalized. In the example embodiment, the ruthenium (Ru) M0 metal tracks 2030 connect to the individual stacked NMOS and PMOS transistors, e.g., the upper semiconductor devices 101b and 102b and the lower semiconductor devices 101a and 101b, using ruthenium (Ri) vias, and the M0 metal tracks 2030 connect to the merged NMOS and PMOS that have common gates, e.g., the third upper and lower semiconductor devices 103b and 103a and the fourth upper and lower semiconductor devices 104b and 104a, also through ruthenium (Ru) vias which make contact to the upper-tier portion of the common gates.

Accordingly, techniques herein enable formation of a split-gate stacked CFET. In some embodiments, a work function metal stack is formed around both PMOS and NMOS channels. The WFM stack can be deposited by atomic layer deposition (ALD). It is challenging to deposit WFM by selective deposition, so a blanket deposition can be executed followed by a recess step. This tungsten and/or other metal are recessed by vapor-phase isotropic etching. Then a low temperature oxide layer is formed on the recessed PMOS work function metal to separate gate regions. For example, a mask can optionally be formed to form areas having a split gate compared to a common gate. Material selection is such that the PMOS WFM is the only metal uncovered on the substrate. A self-assembled mono-layer (SAM) is deposited on the substrate either by vapor deposition or spin-on deposition. SAMs can be selected that only adhere to dielectric surfaces, leaving the metal surfaces uncovered. The SAMs will then prevent oxide from depositing on the dielectric surfaces so that the oxide is deposited only on the PMOS WFM. SAMs can be compromised by heat and plasma, so the oxide deposition process deposits the oxide at temperatures below a thermal decomposition temperature of a corresponding SAM, or below about 350° C. The oxide is also deposited using a plasma-free deposition process. Additional processing steps can be executed and individual vias can be formed for metal layer M0 to each of the transistors in a staircased profile.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this present disclosure. As such, the foregoing descriptions of embodiments of the present disclosure are not intended to be limiting. Rather, any limitations to embodiments of the present disclosure are presented in the following claims.

What is claimed is:

1. A method, comprising:
providing a semiconductor structure including a first lower semiconductor device and a first upper semiconductor device stacked vertically over the first lower semiconductor device, the first lower semiconductor device having one or more first lower channels, the first upper semiconductor device having one or more first upper channels, first work function metal (WFM) covering the first lower channels and the first upper channels;
removing a portion of the first WFM to uncover the first upper channels of the first upper semiconductor device, with the first lower channels of the first lower semiconductor device covered by a remaining of the first WFM that is under the portion of the first WFM;
depositing a monolayer on uncovered dielectric surfaces of the semiconductor structure;
depositing isolation dielectric only on the remaining of the first WFM of the first lower semiconductor device, the isolation dielectric isolating the first lower semiconductor device from the first upper semiconductor device; and
depositing second WFM on the isolation dielectric to cover the first upper channels of the first upper semiconductor device.

2. The method of claim 1, wherein the isolation dielectric is deposited using a plasma-free deposition process.

3. The method of claim 1, wherein the isolation dielectric is deposited at a temperature below 350 degrees Celsius.

4. The method of claim 1, wherein the monolayer includes a self-assembled monolayer (SAM), and depositing the monolayer includes depositing the SAM on the uncovered dielectric surfaces while the first WFM remains uncovered by the SAM.

5. The method of claim 4, wherein the SAM is configured to resist deposition of the isolation dielectric.

6. The method of claim 1, wherein the first upper semiconductor device includes one or more n-type metal oxide semiconductor (NMOS) devices, and the first lower semiconductor device includes one or more p-type metal oxide semiconductor (PMOS) devices.

7. The method of claim 6, wherein the first WFM includes TiN, and the second WFM includes TiAl.

8. The method of claim 1, wherein the first lower semiconductor device and the first upper semiconductor device include lateral gate-around (GAA) transistors with the first lower channels and the first upper channels formed from nanosheets.

9. The method of claim 1, wherein the semiconductor structure further includes a second lower semiconductor device and a second upper semiconductor device stacked vertically over the second lower semiconductor device, the second lower semiconductor device and the second upper semiconductor device laterally adjacent to the first lower semiconductor device and the first upper semiconductor device, and the method further comprises:

etching the semiconductor structure to form a cut area between the first lower and upper semiconductor devices and the second lower and upper semiconductor devices; and filling the cut area with separation dielectric to separate the first lower and upper semiconductor devices from the second lower and upper semiconductor devices.

10. The method of claim 9, wherein the isolation dielectric acts as an etch stop when the semiconductor structure is etched.

11. The method of claim 9, wherein the semiconductor structure is etched beyond a length of the isolation dielectric.

12. The method of claim 9, further comprising:

covering the uncovered first upper channels of the first upper semiconductor device with a gap-fill material;

transferring an isolation dielectric pattern corresponding to the isolation dielectric onto the gap-fill material; and etching the gap-fill material based on the isolation dielectric pattern to uncover the first upper channels of the first upper semiconductor device.

13. The method of claim 12, wherein etching the gap-fill material includes:

anisotropically etching the gap-fill material based on the isolation dielectric pattern, with the gap-fill material blocked by the first upper channels intact; and isotropically etching the gap-fill material blocked by the first upper channels.

14. The method of claim 13, wherein the isolation dielectric pattern is biased from the isolation dielectric.

*   *   *   *   *